US012709654B2

(12) United States Patent
Harada et al.

(10) Patent No.: US 12,709,654 B2
(45) Date of Patent: Aug. 18, 2026

(54) POLYMER, COPOLYMER, INK, INK CONTAINER, IMAGE FORMING METHOD, IMAGE FORMING DEVICE, AND BACKSHEET FOR SOLAR CELL

(71) Applicants: Shigeyuki Harada, Shizuoka (JP); Toshiyuki Kobashi, Tokyo (JP)

(72) Inventors: Shigeyuki Harada, Shizuoka (JP); Toshiyuki Kobashi, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 708 days.

(21) Appl. No.: 18/158,639

(22) Filed: Jan. 24, 2023

(65) Prior Publication Data

US 2023/0242689 A1 Aug. 3, 2023

(30) Foreign Application Priority Data

Jan. 28, 2022 (JP) ................................ 2022-011896
Jul. 22, 2022 (JP) ................................ 2022-117030

(51) Int. Cl.
*C09D 11/03* (2014.01)
*C08F 30/02* (2006.01)
*H10F 77/50* (2025.01)

(52) U.S. Cl.
CPC .............. *C08F 30/02* (2013.01); *C09D 11/03* (2013.01); *H10F 77/50* (2025.01)

(58) Field of Classification Search
CPC ....... C08F 30/02; C08F 220/06; C09D 11/106
See application file for complete search history.

(56) References Cited

U.S. PATENT DOCUMENTS

2014/0198160 A1 7/2014 Harada et al.
2015/0056425 A1 2/2015 Nagai et al.
(Continued)

FOREIGN PATENT DOCUMENTS

JP 2014-015541 1/2014
JP 2014-040553 3/2014
(Continued)

OTHER PUBLICATIONS

JP6507868B2 English (Year: 2019).*

*Primary Examiner* — Catherine S Branch
*Assistant Examiner* — Huihong Qiao
(74) *Attorney, Agent, or Firm* — Grüneberg Global IP, PLLC

(57) ABSTRACT

A polymer having a structural unit represented by the following Chemical Formula 1, Chemical Formula 1 where $R_1$ represents hydrogen or a methyl group, $L_1$ represents —COO—, —CONH—, or a single bond, X represents a hydrocarbon group having 2 to 10 carbon atoms or a hydrocarbon group having 2 to 10 carbon atoms and containing oxygen, $L_2$ represents —O— or —NH—, Y represents a hydrocarbon group having 2 to 12 carbon atoms, and
(Continued)

$L_3$ represents $—NH—C_2H_4—R_2$, $—O\text{-}Ph\text{-}CH_2CH(R_2)_2$, or $—O—Np—CH_2CH(R_2)_2$, where Ph represents a phenylene group, Np represents a naphthylene group, and $R_2$ represents a phosphonic acid group.

9 Claims, 1 Drawing Sheet

(56) References Cited

U.S. PATENT DOCUMENTS

| | | | | |
|---|---|---|---|---|
| 2015/0252203 | A1 | 9/2015 | Matsuyama et al. | |
| 2015/0291817 | A1 | 10/2015 | Katoh et al. | |
| 2016/0017075 | A1 | 1/2016 | Harada et al. | |
| 2016/0032037 | A1 | 2/2016 | Harada et al. | |
| 2016/0075892 | A1 | 3/2016 | Harada et al. | |
| 2016/0102162 | A1 | 4/2016 | Harada et al. | |
| 2016/0130452 | A1 | 5/2016 | Katoh et al. | |
| 2016/0168292 | A1 | 6/2016 | Fukuoka et al. | |
| 2016/0222234 | A1 | 8/2016 | Matsuyama et al. | |
| 2016/0362572 | A1 | 12/2016 | Matsuyama et al. | |
| 2017/0073533 | A1 | 3/2017 | Fukuoka et al. | |
| 2017/0121544 | A1 | 5/2017 | Koizuka et al. | |
| 2017/0158794 | A1* | 6/2017 | Harada | C08F 222/22 |
| 2017/0174918 | A1 | 6/2017 | Yanagawa et al. | |
| 2017/0267884 | A1 | 9/2017 | Koizuka et al. | |
| 2018/0002469 | A1 | 1/2018 | Harada et al. | |
| 2018/0002553 | A1 | 1/2018 | Harada et al. | |
| 2019/0136076 | A1 | 5/2019 | Koizuka et al. | |
| 2019/0264050 | A1 | 8/2019 | Harada et al. | |
| 2019/0276694 | A1 | 9/2019 | Yamazaki et al. | |
| 2020/0263049 | A1 | 8/2020 | Harada et al. | |
| 2020/0277505 | A1 | 9/2020 | Yamazaki et al. | |
| 2022/0126605 | A1 | 4/2022 | Saiga et al. | |

FOREIGN PATENT DOCUMENTS

| | | | | |
|---|---|---|---|---|
| JP | 6507868 B2 * | 5/2019 | C08F 220/58 |
| JP | 2020-111658 | 7/2020 | |
| WO | WO2020/128732 A2 | 6/2020 | |

* cited by examiner

POLYMER, COPOLYMER, INK, INK CONTAINER, IMAGE FORMING METHOD, IMAGE FORMING DEVICE, AND BACKSHEET FOR SOLAR CELL

CROSS-REFERENCE TO RELATED APPLICATIONS

This patent application is based on and claims priority pursuant to 35 U.S.C. § 119 to Japanese Patent Application Nos. 2022-011896 and 2022-117030, filed on Jan. 28, 2022, and Jul. 22, 2022, respectively, in the Japan Patent Office, the entire disclosures of which are hereby incorporated by reference herein.

BACKGROUND

Technical Field

The present disclosure relates to a polymer, a copolymer, an ink, an ink container, an image forming method, an image forming device, and a backsheet for solar cell.

Description of the Related Art

Inkjet printers are widely used for printing on paper media. For other media such as transparent or colored plastic film and colored fabrics, white ink is required to conceal the background in addition to black ink, yellow ink, magenta ink, and cyan ink.

One of such white inks suitable for concealing the background is titanium oxide, rutile form, having a high refractive index.

SUMMARY

According to embodiments of the present disclosure, a polymer is provided which has a structural unit represented by the following Chemical Formula 1.

Chemical Formula 1

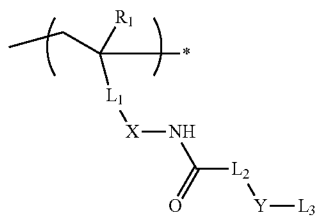

In Chemical Formula 1, $R_1$ represents hydrogen or a methyl group, $L_1$ represents —COO—, —CONH—, or a single bond, X represents a hydrocarbon group having 2 to 10 carbon atoms or a hydrocarbon group having 2 to 10 carbon atoms and containing oxygen, $L_2$ represents —O— or —NH—, Y represents a hydrocarbon group having 2 to 12 carbon atoms, and $L_3$ represents —NH—$C_2H_4$—$R_2$, —O-Ph-$CH_2CH(R_2)_2$, or —O—Np—$CH_2CH(R_2)_2$, where Ph represents a phenylene group, Np represents a naphthylene group, and $R_2$ represents a phosphonic acid group.

As another aspect of embodiments of the present disclosure, a copolymer is provided which has the structural unit represented by the following Chemical Formula 1 of the polymer mentioned above and a structural unit represented by Chemical Formula 2, Chemical Formula 2

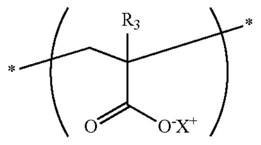

where $R_3$ represents hydrogen or a methyl group and $X^+$ represents a proton or a cation.

As another aspect of embodiments of the present disclosure, an ink I is provided which contains water, a coloring material, and a resin which contains one of the polymer mentioned above and/or the copolymer mentioned above.

As another aspect of embodiments of the present disclosure, an ink container is provided which contains the ink mentioned above.

As another aspect of embodiments of the present disclosure, an image forming method is provided which includes discharging the ink mentioned above to a printing medium to form an image thereon.

As another aspect of embodiments of the present disclosure, an image forming device is provided which includes an ink container containing the ink mentioned above and a discharging device for discharging the ink to a printing medium.

As another aspect of embodiments of the present disclosure, a backsheet for a solar cell is provided which includes a protection layer containing titanium oxide and resin,

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
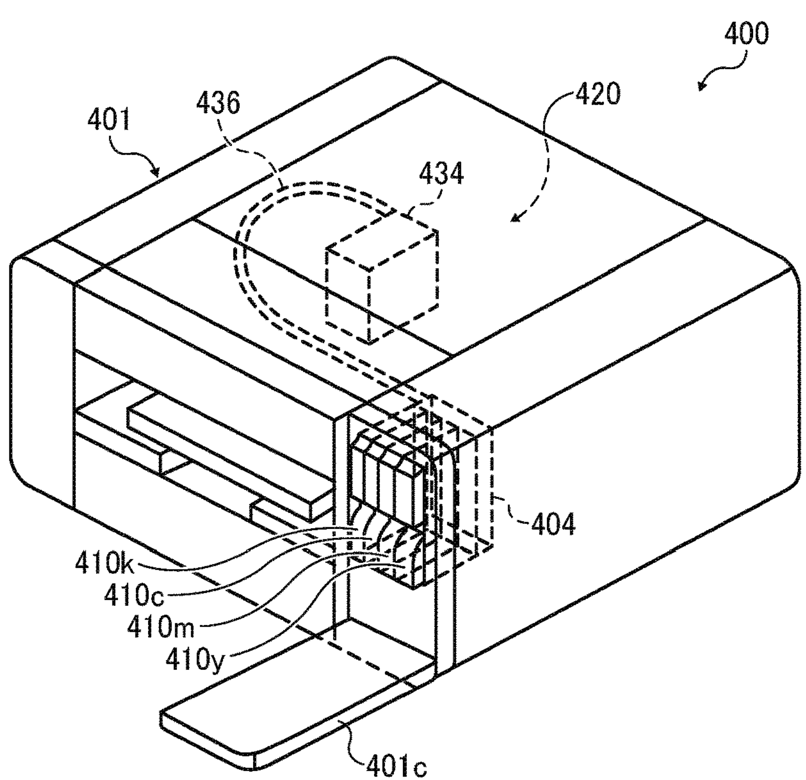
FIG. 1 is a schematic diagram illustrating an image forming device.

The accompanying drawings are intended to depict example embodiments of the present invention and should not be interpreted to limit the scope thereof. The accompanying drawings are not to be considered as drawn to scale unless explicitly noted. Also, identical or similar reference numerals designate identical or similar components throughout the several views.

DESCRIPTION OF THE EMBODIMENTS

The terminology used herein is for the purpose of describing particular embodiments only and is not intended to be limiting of the present invention. As used herein, the singular forms “a,” “an,” and “the” are intended to include the plural forms as well, unless the context clearly indicates otherwise. It will be further understood that the terms “includes” and/or “including”, when used in this specification, specify the presence of stated features, integers, steps, operations, elements, and/or components, but do not preclude the presence or addition of one or more other features, integers, steps, operations, elements, components, and/or groups thereof.

Embodiments of the present invention are described in detail below with reference to accompanying drawings. In describing embodiments illustrated in the drawings, specific terminology is employed for the sake of clarity. However, the disclosure of this patent specification is not intended to be limited to the specific terminology so selected, and it is to be understood that each specific element includes all technical equivalents that have a similar function, operate in a similar manner, and achieve a similar result.

For the sake of simplicity, the same reference number will be given to identical constituent elements such as parts and materials having the same functions and redundant descriptions thereof omitted unless otherwise stated.

According to the present disclosure, a polymer or copolymer is provided which can manufacture a coloring material dispersion having an excellent storage stability, an ink having an excellent storage stability and re-dispersibility, and a backsheet for solar cell having an excellent resistance to weather Polymer The polymer of the present disclosure has a structural unit represented by the following Chemical Formula 1.

Chemical Formula 1

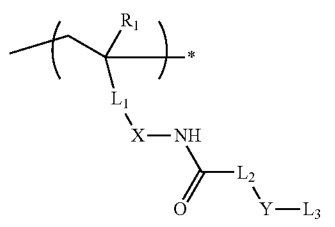

In Chemical Formula 1, $R_1$ represents hydrogen or a methyl group, $L_1$ represents —COO—, —CONH—, or a single bond, X represents a hydrocarbon group having 2 to 10 carbon atoms or a hydrocarbon group having 2 to 10 carbon atoms and containing oxygen, $L_2$ represents —O— or —NH—, Y represents a hydrocarbon group having 2 to 12 carbon atoms, and $L_3$ represents —NH—$C_2H_4$—$R_2$, —O-Ph-$CH_2CH(R_2)_2$, or —O—Np—$CH_2CH(R_2)_2$, where Ph represents a phenylene group, Np represents a naphthylene group, and $R_2$ represents a phosphonic acid group.

Titanium oxide, rutile form, for use in white ink having a high concealing property, has a specific gravity of 4.17 g/mL. This oxide is known to settle out in an ink or a coloring material dispersion overtime, resulting in separation in the end. Such ink or coloring material can be used without a problem if the ink or coloring material dispersion is back to the original dispersion by stirring or shaking. However, titanium oxide accumulating at the lower lay of an ink or coloring material dispersion agglomerates, preventing the ink or coloring material from restoring the state of dispersion. In addition, this problem of an ink or coloring material not returning to dispersion increases their viscosity, degrades the concealing ratio by white, and causes defective discharging.

Typical dispersant for titanium oxide, which is an A-B block copolymer having an A-B block type carboxylic group having methacrylate containing an aliphatic cyclic alkyl group having at least 6 carbon atoms and methacrylic acid as the constituting components disclosed in Japanese Patent No. 5863600 (Japanese Unexamined Patent Application Publication No. 2014-040553) needs a further enhancement on the storage stability of ink and re-dispersibility of a coloring material.

According to an investigation, the inventors of the present invention have found that a coloring material dispersion having an excellent storage stability and an ink having an excellent storage stability and re-dispersibility are obtained by using a polymer having a structural unit represented by Chemical Formula 1.

Moreover, the inventors have also found that, by using a polymer having a structural unit represented by Chemical Formula 1, a film can be obtained in which a coloring material such as titanium oxide uniformly dispersed without aggregation. The film obtained can be applied to a backsheet for solar cell as a protection layer, thereby making the backsheet have an excellent resistance to weather.

Therefore, the inventors have formulated a polymer or copolymer which can manufacture a coloring material dispersion having an excellent storage stability, an ink having an excellent storage stability and re-dispersibility, and a backsheet for solar cell having an excellent resistance to weather by using a polymer having a structural unit represented by Chemical Formula 1.

Polymer Having Structural Unit Represented by Chemical Formula 1

The polymerizable monomer of the present disclosure has the structural unit represented by the following Chemical Formula 1 and other optional polymerizable monomers.

Chemical Formula 1

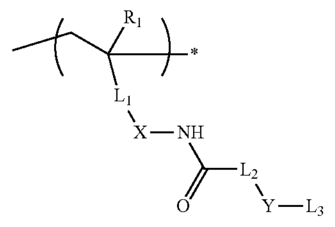

In Chemical Formula 1, $R_1$ represents hydrogen or a methyl group, $L_1$ represents —COO—, —CONH—, or a single bond, X represents a hydrocarbon group having 2 to 10 carbon atoms or a hydrocarbon group having 2 to 10 carbon atoms and containing oxygen, $L_2$ represents —O— or —NH—, Y represents a hydrocarbon group having 2 to 12 carbon atoms, and $L_3$ represents —NH—$C_2H_4$—$R_2$, —O-Ph-$CH_2CH(R_2)_2$, or —O—Np—$CH_2CH(R_2)_2$, where Ph represents a phenylene group, Np represents a naphthylene group, and $R_2$ represents a phosphonic acid group.

In this specification, the structural unit represented by Chemical Formula 1 is also referred to as "first monomer".

In this specification, the polymer having the structural unit represented by Chemical Formula 1 is also referred to as "monomer". In the specification, the polymer of the present disclosure containing other polymerizable monomers is also described as "polymer" for convenience.

In the polymer having a structural unit represented by Chemical Formula 1, phosphonic acid group present at the terminal enhances the adsorption with the surface of particles of titanium oxide, titanium oxide surface-treated with alumina, barium sulfate. —NH—CO—NH— group or —NH—COO-group linked with the linking group X and the linking group Y in the Chemical Formula 1 impart water-solubility to the polymer. Because of this water-solubility, when the polymer of the present disclosure is used to prepare a coloring material dispersion in which a coloring material described later is dispersed in water, the coloring material dispersion can have an excellent dispersibility and be stable for a long period of time.

The number average molecular weight (Mn) and the weight average molecular weight (Mw) of the polymer of the present disclosure are preferably 2,000 to 20,000 and 5,000 to 50,000 and more preferably 5,000 to 15,000 and 15,000 to 40,000, respectively, to achieve a good storage stability of a dispersion and an ink.

The method of synthesizing the polymer of the present disclosure is not particularly limited and can be suitably selected to suit to a particular application. One of the synthesis methods is as follows:

(1) 2-aminoethylphosphonic acid diethyl ester (A1) is allowed to react with a diamine or amino alcohol (A2) to obtain a phosphonic diester derivative (A3);

(1)

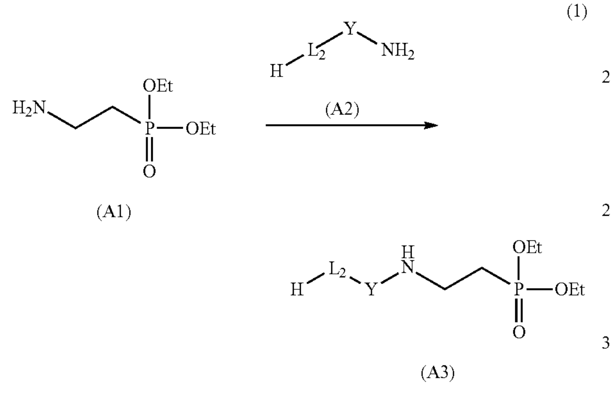

(A1) (A2) (A3)

(2) the phosphonic diester derivative (A3) is allowed to react with an isocyanate compound (A4) having a polymerizable group to obtain a phosphonic diester derivative (A5);

(2)

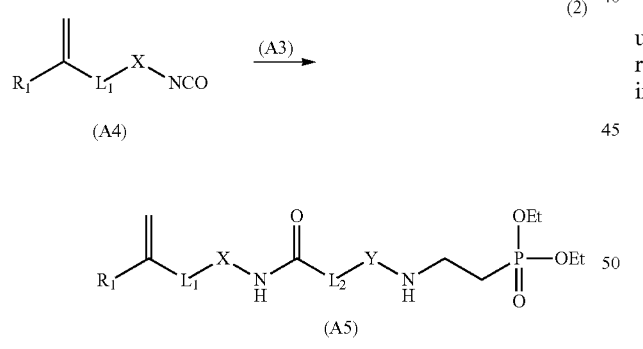

(A4) (A3) (A5)

(3) The phosphonic diester derivative (A5) is allowed to react with trimethylsilyl bromide to form a trimethylsilyl ester (A6), which is then hydrolyzed to obtain a polymerizable phosphonic acid group monomer (A7); and (3)

(A5)

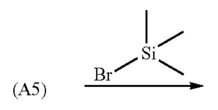

-continued

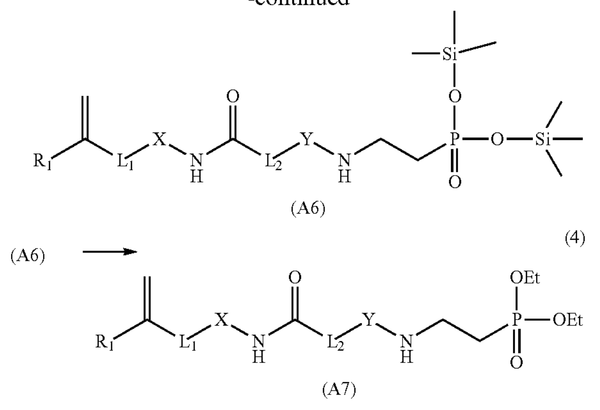

(A6)

(4)

(A6)

(A7)

(4) The monomer (A7) is polymerized under the presence of a radical polymerization initiator to obtain the polymer of the present disclosure.

(5)

(A7)

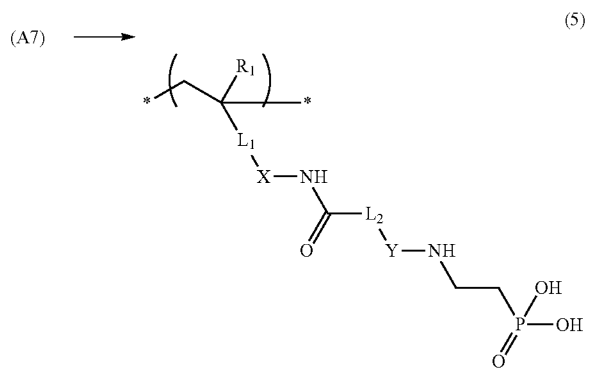

Copolymer

Structural Unit Represented by Chemical Formula 2

The copolymer of the present disclosure has the structural unit represented by Chemical Formula 1, the structural unit represented by Chemical Formula 2, and may optionally include other polymerizable monomers.

Chemical Formula 2

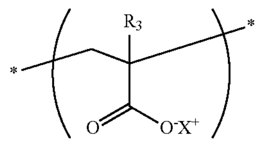

In Chemical Formula 2, $R_3$ represents hydrogen or a methyl group and $X^+$ represents a proton or a cation.

In this specification, the structural unit represented by Chemical Formula 2 is also referred to as a "second monomer".

In this specification, the "copolymer having the structural unit represented by Chemical Formula 1 and the structural unit represented by Chemical Formula 2" is also referred to as a "copolymer".

The proton or a cation in Chemical Formula 2 induces the electrostatic repulsion between the molecules of a copolymer. Because of this repulsion, the dispersibility, re-dispersibility, and storage stability of a coloring material dispersion are enhanced when the copolymer of the present disclosure is used to prepare the coloring material dispersion in which a coloring material described later is dispersed in water.

The proton or cation is not particularly limited and can be suitably selected to suit to a particular application.

Specific examples of the cation include, but are not limited to, sodium ion, potassium ion, lithium ion, tetramethyl ammonium ion, tetraethyl ammonium ion, tetrapropyl ammonium ion, tetrabutyl ammonium ion, tetrapentyl ammonium ion, tetrahexyl ammonium ion, triethylmethyl ammonium ion, tributylmethyl ammonium ion, trioctylmethyl ammonium ion, 2-hydroxyethyl trimethyl ammonium ion, tris(2-hydroxyethyl)methyl ammonium ion, propyltrimethyl ammonium ion, hexyltrimethyl ammonium ion, octyltrimethyl ammonium ion, nonyltrimethyl ammonium ion, decyltrimethyl ammonium ion, dodecyltrimethyl ammonium ion, tetradecyltrimethyl ammonium ion, hexadecyl trimethyl ammonium ion, octadecyl trimethyl ammonium ion, didodecyl dimethyl ammonium ion, ditetradecyl dimethyl ammonium ion, dihexyadecyl dimethyl ammonium ion, dioctadecyl dimethyl ammonium ion, ethylhexadecyl dimethyl ammonium ion, ammonium ion, dimethyl ammonium ion, trimethyl ammonium ion, monoethyl ammonium ion, diethyl ammonium ion, triethyl ammonium ion, monoethanol ammonium ion, diethanol ammonium ion, triethanol ammonium ion, methyl ethanol ammonium ion, methyldiethanol ammonium ion, dimethylethanol ammonium ion, monopropanol ammonium ion, dipropanol ammonium ion, tripropanol ammonium ion, isopropanol ammonium ion, morpholinium ion, N-methyl morpholinium ion, N-methyl-2-pyrolidonium ion, and 2-pyrolidonium ion.

The number average molecular weight (Mn) and the weight average molecular weight (Mw) of the copolymer of the present disclosure are preferably from 2,000 to 20,000 and from 5,000 to 50,000 and more preferably from 5,000 to 15,000 and from 15,000 to 40,000, respectively, to achieve a good storage stability of a dispersion and an ink.

The structure of the copolymer of the present disclosure is not particularly limited and can be suitably selected to suit to a particular application. Examples include, but are not limited to, a random copolymer, a graft copolymer, and a block copolymer.

The method of synthesizing the copolymer of the present disclosure is not particularly limited and can be suitably selected to suit to a particular application. One way of synthesizing the copolymer is to copolymerize the polymerizable phosphonic acid group monomer (A7) in the synthesis described above with (meth)acrylic acid.

Other Polymerizable Compound

The polymer or copolymer of the present disclosure has a structural unit represented by Chemical Formula 1, a structure unit represented by Chemical Formula 2, and other optional polymerizable monomers.

Such other polymerizable monomers are not particularly limited and can be suitably selected to suit to a particular application. Examples thereof are polymerizable hydrophobic monomers, polymerizable hydrophilic monomers, and polymerizable surfactants.

In the specification, the "other optional polymerizable monomer" is also referred to as "third monomer".

Polymerizable Hydrophobic Monomer

The polymerizable hydrophobic monomers are nor particularly limited and can be suitably selected to suit to a particular application.

Specific examples include, but are not limited to, unsaturated ethylene monomers having aromatic ring such as α-methyl styrene, 4-t-butyl styrene, and 4-chloromethyl styrene; (meth)acrylic acid alkyl such as methyl (meth)acrylate, ethyl(meth)acrylate, n-butyl(meth)acrylate, dimethyl maleate, dimethyl itaconate, dimethyl fumarate, lauryl (meth)acrylate (C12), tridecyl(meth)acrylate (C13), tetradecyl(meth)acrylate (C14), pentadecyl(meth)acrylate (C15), hexadecyl(meth)acrylate (C16), heptadecyl(meth)acrylate (C17), nonadecyl(meth)acrylate (C19), eicosyl (meth)acrylate (C20), heneicosyl(meth)acrylate (C21), and docosyl(meth)acrylate (C22); and unsaturated ethylene monomers having an alkyl group such as 1-heptene, 3,3-dimethyl-1-pentene, 4,4-dimethyl-1-pentene, 3-methyl-1-hexene, 4-methyl-1-hexene, 5-methyl-1-hexene, 1-octene, 3,3-dimethyl-1-hexene, 3,4-dimethyl-1-hexene, 4,4-dimethyl-1-hexene, 1-nonene, 3,5,5-trimethyl-1-hexene, 1-decene, 1-undecene, 1-dodecene, 1-tridecene, 1-tetracene, 1-pentadecene, 1-hexadecene, 1-heptadecene, 1-octadecene, 1-nonadecene, 1-eicosene, and 1-docosene. These can be used alone or in combination.

Polymerizable Hydrophilic Monomer

Specific examples of the polymerizable hydrophilic monomers include, but are not limited to, anionic unsaturated ethylene monomers such as maleic acid or salts thereof, monomethyl maleate, itaconic acid, monomethyl itaconate, fumaric acid, 4-styrene sulfonic acid, 2-acrylic amide-2-methyl propane sulfonic acid, or anionic unsaturated ethylene monomers such as unsaturated ethylenic monomers having phosphoric acid, phosphonic acid, alendronic acid, or etidronic acid; and nonionic unsaturated ethylene monomers such as 2-hydroxyethyl (meth)acrylic acid, diethylene glycol mono(meth)acrylate, triethylene glycol mono(meth)acrylate, tetraethylene glycol mono(meth)acrylate, polyethylene glycol mono(meth)acrylate, (meth)acrylamide, N-methylol(meth)acrylamide, N-vinyl formamide, N-vinylacetoamide, N-vinylpyrrolidone, acrylamide, N,N-dimethyl acrylamide, N-t-butyl acrylamide, N-octyl acrylamide, and N-t-octyl acrylamide.

The proportion of the polymerizable hydrophobic monomer and the polymerizable hydrophilic monomer is not particularly limited and can be suitably selected to suit to a particular application. It is possibly from 5 to 100 percent by mass to the sum of the monomers forming a polymer having a structural unit represented by Chemical Formula 1 or the monomers forming a copolymer having a structural unit represented by Chemical Formula 1 and a structural unit represented by Chemical Formula 2.

Polymerizable Surfactant

The polymerizable surfactant mentioned above contains at least one radically-polymerizable unsaturated double bond group in its molecule. Examples include, but are not limited to, an anionic surfactant and a nonionic surfactant.

Anionic Surfactant

The anionic surfactant is not particularly limited and can be suitably selected to suit to a particular application.

Examples include, but are not limited to, a hydrocarbon compound having a sulfate group such as ammonium sulfate group ($—SO_3—NH_4^+$) and an allyl group ($—CH_2—CH═CH_2$), a hydrocarbon compound having a sulfate group such as ammonium sulfate group ($—SO_3—NH_4$) and a methacylic group [$(—CO—C(CH_3)═CH_2$], and an aromatic hydrocarbon compound having a sulfate group such as ammonium sulfate group ($—SO_3—NH_4^+$) and a 1-propenyl group ($—CH═CH_2CH_3$).

Specific examples of the anionic surfactant include, but are not limited to, ELEMINOL JS-20 and RS-300 (both manufactured by Sanyo Chemical Industries, Ltd.) and Aqualon KH-10, Aqualon KH-1025, Aqualon KH-05, Aqualon HS-10, Aqualon HS-1025, Aqualon BC-0515, Aqualon BC-10, Aqualon BC-1025, Aqualon BC-20, and Aqualon BC-2020 (all manufactured by DKS Co. Ltd.).

Nonionic Surfactant

The nonionic surfactant is not particularly limited and can be suitably selected to suit to a particular application. Examples include, but are not limited to, a hydrocarbon compound or an aromatic hydrocarbon compound having 1-propenyl group ($—CH═CH_2CH_3$) and a polyoxyethylene group [$—(C_2H_4O)_n—H$].

Specific examples of the nonionic surfactant include, but are not limited to, Aqualon RN-20, Aqualon RN-2025, Aqualon RN-30, and Aqualon RN-50 (all manufactured by DKS Co. Ltd.) and LATEMUL PD-104, LATEMUL PD-420, LATEMUL PD-430, and LATEMUL PD-450 (all manufactured by Kao Corporation).

The proportion of the polymerizable surfactant is not particularly limited and can be suitably selected to suit to a particular application. For example, it is possibly from 0.1 to 10 percent by mass to the sum of the monomers forming a polymer having a structural unit represented by Chemical Formula 1 or the monomers forming a copolymer having a structural unit represented by Chemical Formula 1 and a structural unit represented by Chemical Formula 2.

A radical polymerization initiator may be used in the process of forming the polymer or the copolymer of the present disclosure.

The radical polymerization initiator is not particularly limited and can be suitably selected to suit to a particular application.

Specific examples include, but are not limited to, peroxyketal, hydroperoxide, dialkyl peroxide, diacyl peroxide, peroxydicarbonate, peroxyester, cyano-based azobisisobutyronitrile, azobis (2-methylbutyronitrile), azobis (2,2'-isovaleronitrile), and non-cyano-based dimethyl-2,2'-azobisisobutyrate. Of these, organic peroxides and azo-based compounds are preferable and azo-based compounds are more preferable because their molecular weight can be easily adjusted and they are decomposed at low temperatures.

The proportion of the radical polymerization initiator is not particularly limited and can be suitably selected to suit to a particular application. It is preferably from 1 to 10 percent by mass to the sum of polymerizable monomers.

The polymerizable monomer includes all of the monomers forming a polymer having a structural unit represented by Chemical Formula 1, the monomers forming a copolymer having a structural unit represented by Chemical Formula 2, and all the other polymerizable monomers.

To adjust the molecular weight of the polymer and the copolymer of the present disclosure, a chain transfer agent is optionally added.

The chain transfer agent is not particularly limited and can be suitably selected to suit to a particular application.

Specific examples thereof include, but are not limited to, mercapto acetate, mercapto propionate, 2-propane thiol, 2-meracapto ethanol, thiophenol, dodecyl mercaptane, 1-dodecane thiol, and thioglycerol.

The polymerization temperature of the polymer and the copolymer of the present disclosure is not particularly limited and can be suitably selected to a particular application. It is preferably from 50 to 150 degrees C. and more preferably from 60 to 100 degrees C.

The polymerization time for forming the polymer and the copolymer of the present disclosure is not particularly limited and can be suitably selected to a particular application. It is preferably from 3 to 48 hours.

Ink

The ink of the present disclosure contains water, a coloring material, a resin, and other optional components.

Water

Water contained in the ink of the present disclosure is not particularly limited and can be suitably selected to suit to a particular application.

The proportion of water in the ink of the present disclosure is not particularly limited and can be suitably selected to suit to a particular application. It is preferably from 10 to 90 percent by mass and more preferably from 20 to 60 percent by mass to the entire of ink to quickly dry and reliably discharge the ink.

Coloring Material

The ink contained in the ink of the present disclosure is not particularly limited and can be suitably selected to suit to a particular application. Examples include, but are not limited to, a pigment and a dye. A mixed crystal can also be used as the coloring material.

Pigment

The pigment mentioned above is not particularly limited and can be suitably selected to suit to a particular application. It includes, but is not limited to, black pigments, yellow pigments, magenta pigments, cyan pigments, white pigments, green pigments, orange pigments, and gloss or metallic pigments of gold, silver, and others.

The pigment includes an inorganic pigment and organic pigment.

The inorganic pigment mentioned above is not particularly limited and can be suitably selected to suit to a particular application. Examples include, but are not limited to, titanium oxide, iron oxide, calcium oxide, barium sulfate, aluminum hydroxide, barium yellow, cadmium red, and chrome yellow, carbon black manufactured by known methods such as contact methods, furnace methods, and thermal methods can be used.

The organic pigment is not particularly limited and can be suitably selected to suit to a particular application.

Specific examples include, but are not limited to, azo pigments, polycyclic pigments (e.g., phthalocyanine pigments, perylene pigments, perinone pigments, anthraquinone pigments, quinacridone pigments, dioxazine pigments, indigo pigments, thioindigo pigments, isoindolinone pigments, and quinophthalone pigments), dye chelates (e.g., basic dye type chelates and acid dye type chelates), nitro pigments, nitroso pigments, and aniline black.

Of these pigments, pigments having good affinity with solvents are preferable. In addition, resin hollow particles or inorganic hollow particles can be used.

Examples of the pigment include, but are not limited to the following.

Specific examples of the black pigments include, but are not limited to, carbon black (C.I. Pigment Black 7) such as furnace black, lamp black, acetylene black, and channel black, metals such as copper, iron (C.I. Pigment Black 11), and titanium oxides, and organic pigments such as aniline black (C.I. Pigment Black 1).

Specific examples of the color pigment include, but are not limited to, C. I. I. pigment yellow 1, C. I. pigment yellow 3, C. I. pigment yellow 12, C. I. pigment yellow 13, C. I. pigment yellow 14, C. I. pigment yellow 17, C. I. pigment yellow 24, C. I. pigment yellow 34, C. I. pigment yellow 35, C. I. pigment yellow 37, C. I. pigment yellow 42 (yellow iron oxide), C. I. pigment yellow 53, C. I. pigment yellow 55, C. I. pigment yellow 74, C. I. pigment yellow 81, C. I. pigment yellow 83, C. I. pigment yellow 95, C. I. Pigment Yellow 97 C. I. Pigment Yellow 98 C. I. Pigment Yellow 100 C. I. Pigment Yellow 101 C. I. Pigment Yellow 104 C. I.

Pigment Yellow 108 C. I. Pigment Yellow 109 C. I. Pigment Yellow 110 C. I. Pigment Yellow 117 C. I. Pigment Yellow 120 C. I. Pigment Yellow 138 C. I. Pigment Yellow 150 C. I. Pigment Yellow 153 C. I. Pigment Yellow 155 C. I. Pigment Yellow 180 C. I. Pigment Yellow 185 C. I. Pigment Yellow 213 C. I. Pigment Orange 5 C. I. Pigment Orange 13 C. I. Pigment Orange 16 C. I. Pigment Orange 17 C. I. Pigment Orange 36, C. I. PigmentOrange 43, C. I. PigmentOrange 51, C. I. PigmentRed 1, C. I. PigmentRed 2, C. I. PigmentRed 3, C. I. PigmentRed 5, C. I. PigmentRed 17, C. I. PigmentRed 22, C. I. PigmentRed 23, C. I. PigmentRed 31, C. I. PigmentRed 38, C. I. PigmentRed 48:2, C. I. PigmentRed 48:2 (Permanent Red 2B (Ca)), C. I. PigmentRed 48:3, C. I. PigmentRed 48:4, C. I. PigmentRed 49:1, C. I. PigmentRed 52:2, C. I. PigmentRed 53:1, C. I. PigmentRed 57:1 (Brilliant Carmine 6B), C. I. PigmentRed 60:1, C. I PigmentRed 63:1, C. I PigmentRed 63:2, C. I. PigmentRed 64:1, C. I. pigment red 81, C. I. pigment red 83, C. I. pigment red 88, C. I. pigment red 101 (red iron oxide), C. I. pigment red 104, C. I. pigment red 105, C. I. pigment red 106, C. I. pigment red 108 (cadmium red), C. I. pigment red 112, C. I. pigment red 114, C. I. pigment red 122 (quinacridone magenta), C. I. pigment red 123, C. I. pigment red 146, C. I. pigment red 149, C. I. pigment red 166, C. I. pigment red 168, C. I. pigment red 170, C. I. pigment red 172, C. I. pigment red 177, C. I. pigment red 178, C. I. pigment red 179, C. I. pigment red 184, C. I. Pigment Red 185, C. I. Pigment Red 190, C. I. Pigment Red 193, C. I. Pigment Red 202, C. I. Pigment Red 207, C. I. Pigment Red 208, C. I. Pigment Red 209, C. I. Pigment Red 213, C. I. Pigment Red 219, C. I. Pigment Red 224, C. I. Pigment Red 254, C. I. Pigment Red 264, C. I. Pigment Violet 1 (Rhodamine Lake), C. I. Pigment Violet 3, C. I. Pigment Violet 5:1, C. I. Pigment Violet 16, C. I. Pigment Violet 19, C. I. Pigment Red 23, C. I. Pigment Violet 38, C. I. Pigment Blue 1, C. I. Pigment Blue 2, C. I. Pigment Blue 15 (Phthalocyanine Blue), C. I. Pigment Blue 15:1, C. I. Pigment Blue 15:2, C. I. Pigment Blue 15:3, C. I. Pigment Blue 15:4 (Phthalocyanine Blue), C. I. Pigment Blue 16, C. I. Pigment Blue 17:1, C. I. Pigment Blue 56, C. I. Pigment Blue 60, C. I. Pigment Blue 63, C. I. Pigment Green 1, C. I. Pigment Green 4, C. I. Pigment Green 7, C. I. Pigment Green 8, C. I. Pigment Green 10, C. I. Pigment Green 17, C. I. Pigment Green 18, and C. I. Pigment Green 36.

Dyes

The dye mentioned above is not particularly limited and can be suitably selected to suit to a particular application. It includes an acidic dye, direct dye, reactive dye, and basic dye. These can be used alone or in combination.

Specific examples of the dye include, but are not limited to, C. I. Acid Yellow 17, C. I. Acid Yellow 23, C. I. Acid Yellow 42, C. I. Acid Yellow 44, C. I. Acid Yellow 79, C. I. Acid Yellow 142, C. I. Acid Red 52, C. I. Acid Red 80, C. I. Acid Red 82, C. I. Acid Red 249, C. I. Acid Red 254, C. I. Acid Red 289, C. I. Acid Blue 9, C. I. Acid Blue 45, C. I. Acid Blue 249, C. I. Acid Black 1, C. I. Acid Black 2, C. I. Acid Black 24, C. I. Acid Black 94, C. I. Food Black 1, C. I. Food Black 2, C. I. Direct Yellow 1 C. I. Direct Yellow 12 C. I. Direct Yellow 24 C. I. Direct Yellow 33 C. I. Direct Yellow 50 C. I. Direct Yellow 55 C. I. Direct Yellow 58 C. I. Direct Yellow 86 C. I. Direct Yellow 132 C. I. Direct Yellow 142 C. I. Direct Yellow 144 C. I. Direct Yellow 173 C. I. Direct Red 1 C. I. Direct Red 80 C. I. Direct Red 81 C. I. Direct Red 225 C. I. Direct Red 227 C. I. Direct Blue 1 C. I. Direct Blue 2 C. I. Direct Blue 15, C. I. Direct Blue 71, C. I. Direct Blue 86, C. I. Direct Blue 87, C. I. Direct Blue 98, C. I. Direct Blue 165, C. I. Direct Blue 199, C. I. Direct Blue 202, C. I. Direct Black 19, C. I. Direct Black 38, C. I. Direct Black 51, C. I. Direct Black 71, C. I. Direct Black 154, C. I. Direct Black 168, C. I. Direct Black 171, C. I. Direct Black 195, C. I. Reactive Red 14, C. I. Reactive Red 32, C. I. Reactive Red 55, C. I. Reactive Red 79, C. I. Reactive Red 249, C. I. Reactive Black 3, C. I. Reactive Black 4, and C. I. Reactive Black 35.

The coloring material for use in the present disclosure is preferably a pigment because it has an excellent absorption to the polymer or the copolymer of the present disclosure and an excellent water resistance and resistance to weather. As the white pigment, titanium oxide and barium sulfate are preferable and titanium oxide is more preferable to achieve a good concealing property.

The proportion of the coloring material contained in the ink of the present disclosure is not particularly limited and can be suitably selected to suit to a particular application. It is preferably from 0.1 to 15 percent by mass and more preferably from 10 to 15 percent by mass to the entire of ink to enhance the image density and achieve a good fixability and discharging stability.

Resin

The resin contained in the ink of the present disclosure contains a polymer having a structural unit represented by Chemical Formula 1 or a copolymer having a structural unit represented by Chemical Formula 1 and a structural unit represented by Chemical Formula 2, and other optional resin (A).

The other resin (A) is not particularly limited and can be suitably selected to suit to a particular application. Examples include, but are not limited to, urethane resins, polyester resins, acrylic-based resins, vinyl acetate-based resins, styrene-based resins, butadiene-based resins, styrene-butadiene-based resins, vinylchloride-based resins, acrylic styrene-based resins, and acrylic silicone-based resins. These can be used alone or in combination.

Resins of the other resin (A) can be the other resin (A).

The resin particle can be suitably synthesized or procured.

The volume average particle diameter of the resin particle is not particularly limited and can be suitably selected to suit to a particular application. The volume average particle diameter is preferably from 10 to 1,000 nm, more preferably from 10 to 200 nm, and particularly preferably from 10 to 100 nm to achieve a good fixability and image hardness.

The average particle diameter of the resin particle can be measured by using a device such as a particle size analyzer (Nanotrac Wave-UT151, manufactured by MicrotracBEL Corp.).

Other Components

The other optional components are not particularly limited and can be suitably selected to suit to a particular application. They include, but are not limited to, organic solvents and additives.

Organic Solvent

The ink of the present disclosure may contain an organic solvent. The polymer and the copolymer of the present disclosure demonstrates water solubility in ink so that the polymer and the copolymer can be used in combination with a hydrophilic organic solvent.

The organic solvent is not particularly limited and can be suitably selected to suit to a particular application.

Specific examples of the organic solvent include, but are not limited to, polyols such as ethylene glycol, diethylene glycol, 1,2-propanediol, 1,3-propanediol, 1,2-butanediol, 1,3-butanediol, 1,4-butanediol, 2,3-butanediol, 3-methyl-1,3-butane diol, triethylene glycol, polyethylene glycol, polypropylene glycol, 1,2-pentanediol, 1,3-pentanediol, 1,4-pentanediol, 2,4-pentanediol, 1,5-pentanediol, 1,2-hexanediol, 1,6-hexanediol, 1,3-hexanediol, 2,5-hexanediol, 1,5-hexanediol, glycerin, 1,2,1.6-hexanetriol, 1.2-ethyl-1,3-hexanediol, ethyl-1,2,1.4-butane triol, 1,2,3-butanetriol, 2,2,1.4-trimethyl-1,3-pentanediol, and petriol; polyol alkylethers such as ethylene glycol monoethylether, ethylene glycol monobutyl ether, diethylene glycol monomethylether, diethylene glycol monoethylether, diethylene glycol monobutyl ether, tetraethylene glycol monomethylether, and propylene glycol monoethylether; polyol arylethers such as ethylene glycol monophenylether and ethylene glycol monobenzylether; nitrogen-containing heterocyclic compounds such as 1.2-pyrrolidone, N-methyl-2-pyrrolidone, N-hydroxyethyl-2-pyrrolidone, 1,3-dimethyl-2-imidazolidinone, ε-caprolactam, and γ-butyrolactone; amides such as formamide, N-methylformamide, N,N-dimethylformamide, 3-methoxy-N,N-dimethyl propioneamide, and 3-buthoxy-N, N-dimethyl propioneamide; amines such as monoethanolamine, diethanolamine, and triethylamine; sulfur-containing compounds such as dimethyl sulfoxide, sulfolane, and thiodiethanol; propylene carbonate, and ethylene carbonate.

Of the organic solvents, a water-soluble organic solvent having a boiling point of 250 degrees C. or lower is preferable because the organic solvent acts as a humectant and achieves a good drying property.

For a paper medium, a polyol compound having 8 or more carbon atoms and a glycol ether compound are suitably used as an organic solvent to enhance the penetration of an ink into the paper medium.

Specific examples of the polyol compound having 8 or more carbon atoms include, but are not limited to, 2-ethyl-1,3-hexanediol and 2,2,4-trimethyl-1,3-pentanediol.

Specific examples of the glycolether compound include, but are not limited to, polyhydric alcohol alkylethers such as ethylene glycol monoethylether, ethylene glycol monobutylether, diethylene glycol monomethylether, diethylene glycol monoethylether, diethylene glycol monobutylether, tetraethylene glycol monomethylether, and propylene glycol monoethylether and polyhydric alcohol arylethers such as ethylene glycol monophenylether and ethylene glycol monobenzylether.

The proportion of the organic solvent mentioned above in the ink is not particularly limited and it can be suitably selected to suit to a particular application. It is preferably from 10 to 60 percent by mass and more preferably from 20 to 60 percent by mass to the entire of ink to quickly dry the ink and reliably discharge it.

Additive

The additive mentioned above is not particularly limited and it can be suitably selected to suit to a particular application. Examples include, but are not limited to, water, a surfactant, defoaming agent, preservatives and fungicides, pH regulator, and corrosion inhibitor, which are used as the other components.

Surfactant Used as Other Component

The surfactant used as the other component is not particularly limited and can be suitably selected to suit to a particular application. It includes, but is not limited to, a fluorochemical surfactant, anionic surfactant, nonionic surfactant, and amphoteric surfactant.

The "surfactant used as other component" in the specification means a surfactant contained in the ink of the present disclosure as the other component and excludes the "other polymerizable monomer".

Silicone-Based Surfactant

There is no specific limitation to the silicone-based surfactant and it can be suitably selected to suit to a particular application. Of these, silicone-based surfactants not decomposed in a high pH of from 11 to 14 are preferable.

Specific examples of the silicone-based surfactant not decomposed in a high pH environment (pH 11 to 14) include, but are not limited to, side-chain modified polydimethyl siloxane, both-terminal modified polydimethyl siloxane, one-terminal-modified polydimethyl siloxane, and side chain both-terminal modified polydimethyl siloxane. Of these, a polyether-modified silicone-based surfactant having a polyoxyethylene group or a polyoxyethylene-polyoxypropylene group as a modifying group is more preferable to enhance the hydrophilicity and increase the solubility in water. These can be used alone or in combination.

The polyether-modified silicon-based surfactant has no particular limit and can be suitably selected to suit to a particular application. One of them is a compound in which the polyalkylene oxide structure represented by the following Chemical Formula S-1 is introduced into the side chain of the Si site of dimethyl polysiloxane.

Chemical Formula S-1

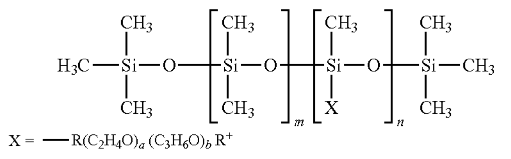

In Chemical Formula S-1, "m", "n", "a", and "b" each, respectively independently represent integers, R represents an alkylene group, and R' represents an alkyl group.

Polyether-modified silicone-containing surfactant can be synthesized or procured.

Specific examples of the products of the polyether-modified silicone-based surfactant include, but are not limited to, KF-618, KF-642, and KF-643 (all manufactured by Shin-Etsu Chemical Co., Ltd.), EMALEX-SS-5602 and EMALEX-SS-1906EX (both manufactured by NIHON EMULSION Co., Ltd.), FZ-2105, FZ-2118, FZ-2154, FZ-2161, FZ-2162, FZ-2163, and FZ-2164 (all manufactured by Dow Corning Toray Co., Ltd.), BYK-33 and BYK-387 (both manufactured by BYK Chemie GmbH), and TSF4440, TSF4452, and TSF4453 (all manufactured by Toshiba Silicone Co. Ltd.).

The silicone-based surfactant can be synthesized and procured.

Products thereof can be procured from manufacturers such as BYK-Chemie GmbH, Shin-Etsu Silicone Co., Ltd., Dow Corning Toray Co., Ltd., NIHON EMULSION Co., Ltd., and Kyoeisha Chemical Co., Ltd.

Fluorochemical Surfactant

The fluorochemical surfactant mentioned above is not particularly limited and can be suitably selected to suit to a particular application. It is preferably a fluorine-substituted compound having 2 to 16 carbon atoms and more preferably a fluorine-substituted compound having 4 to 16 carbon atoms.

The fluorochemical surfactant mentioned above is not particularly limited and can be suitably selected to suit to a particular application.

Specific examples include, but are not limited to, a perfluoroalkyl sulfonic acid compound, perfluoroalkyl carboxylic acid compound, perfluoroalkyl phosphoric acid ester compound, adduct of perfluoroalkyl ethylene oxide, and polyoxyalkylene ether polymer compound having a perfluoroalkyl ether group in its side chain because of their low foaming property.

Specific examples of the perfluoroalkyl sulfonic acid compound include, but are not limited to, perfluoroalkyl sulfonic acid and salts of perfluoroalkyl sulfonic acid.

Specific examples of the perfluoroalkyl carbonic acid compound include, but are not limited to, perfluoroalkyl carbonic acid and salts of perfluoroalkyl carbonic acid.

Specific examples of the polyoxyalkylene ether polymer compound having a perfluoroalkyl ether group in its side chain include, but are not limited to, sulfuric acid ester salts of polyoxyalkylene ether polymer having a perfluoroalkyl ether group in its side chain, and salts of polyoxyalkylene ether polymers having a perfluoroalkyl ether group in its side chain.

Fluorochemical surfactant represented by Chemical Formulae F-1 and F-2 are more preferable.

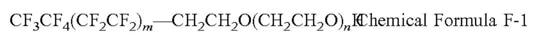

$CF_3CF_4(CF_2CF_2)_m—CH_2CH_2O(CH_2CH_2O)_nH$ Chemical Formula F-1

In the compound represented by Chemical Formula F-1, "m" is preferably 0 or an integer of from 1 to 10 and "n" is preferably 0 or an integer of from 1 to 40.

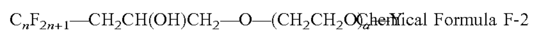

$C_nF_{2n+1}—CH_2CH(OH)CH_2—O—(CH_2CH_2O)_aY$ Chemical Formula F-2

In the compound represented by the Chemical Formula F-2, Y represents H or $C_mF_{2m+1}$, where n represents an integer of from 1 to 6, or $CH_2CH(OH)CH_2—C_mF_{2m+1}$, where m represents an integer of from 4 to 6, or $C_pH_{2p+1}$, where p is an integer of from 1 to 19. n represents an integer of from 1 to 6. a represents an integer of from 4 to 14.

Counter ions of salts in these fluoro-surfactants are, for example, Li, Na, K, $NH_4$, $NH_3CH_2CH_2OH$, $NH_2(CH_2CH_2OH)_2$, and $NH(CH_2CH_2OH)_3$.

Synthetic or procured fluorochemical surfactant can be used.

Specific examples of the procurable products include, but are not limited to, SURFLON S-111, SURFLON S-112, SURFLON S-113, SURFLON S-121, SURFLON S-131, SURFLON S-132, SURFLON S-141, and SURFLON S-145 (all manufactured by AGC Inc.); FLUORAD FC-93, FC-95, FC-98, FC-129, FC-135, FC-170C, FC-430, and FC-431 (all manufactured by Sumitomo 3M Limited); MEGAFACE F-470, F-1405, and F-474 (all manufactured by DIC CORPORATION); ZONYL™ TBS, FSP, FSA, FSN-100, FSN, FSO-100, FSO, FS-300, and UR, CAPSTONE® FS-30, CAPSTONE® FS-31, CAPSTONE® FS-3100, CAPSTONE® FS-34, and CAPSTONE® FS-35 (all manufactured by The Chemours Company); FT-110, FT-250, FT-251, FT-400S, FT-150, and FT-400SW (all manufactured by NEOS COMPANY LIMITED); POLYFOX PF-136A, PF-156A, PF-151N, PF-154, and PF-159 (manufactured by OMNOVA SOLUTIONS INC.), and UNIDYNE DSN-403N (manufactured by DAIKIN INDUSTRIES). Of these, FS-3100, FS-34, and FS-300 (all manufactured by The Chemours Company), FT-110, FT-250, FT-251, FT-400S, FT-150, and FT-400SW (all manufactured by NEOS COMPANY LIMITED), Polyfox PF-151N (manufactured by OMNOVA SOLUTIONS) and Unidyne DSN-403N (manufactured by DAIKIN INDUSTRIES, LTD.) are preferable to achieve good printing quality, particularly significantly enhancing color development, and permeability, wettability, and uniform dyeing to paper.

Amphoteric Surfactant

The amphoteric surfactant is not particularly limited and can be suitably selected to suit to a particular application.

Specific examples include, but are not limited to, lauryl aminopropionic acid salts, lauryl dimethyl betaine, stearyl dimethyl betaine, and lauryl dihydroxyethyl betaine. Those dispersants can be used alone or in combination.

Nonionic Surfactant

The nonionic surfactant is not particularly limited and it can be suitably selected to suit to a particular application.

Specific examples include, but are not limited to, polyoxyethylene alkyl phenyl ethers, polyoxyethylene alkyl esters, polyoxyethylene alkyl amines, polyoxyethylene alkyl amides, polyoxyethylene propylene block polymers, sorbitan aliphatic acid esters, polyoxyethylene sorbitan aliphatic acid esters, and adducts of acetylene alcohol with ethylene oxides. Those dispersants can be used alone or in combination.

Anionic Surfactant

The anionic surfactant is not particularly limited and can be suitably selected to suit to a particular application Specific examples include, but are not limited to, salts such as a polyoxyethylene alkylether acetate, a dodecylbenzene sulfonate, a laurate, and a polyoxyethylene alkylether sulfate. Those dispersants can be used alone or in combination.

The proportion of the surfactant used as the other component is not particularly limited and it can be suitably selected to suit a particular application. It is preferably from 0.001 to 5 percent by mass and more preferably from 0.05 percent by mass to 5 percent by mass to achieve good wettability and discharging stability and enhance the image quality.

Defoaming Agent

The surfactant used as the other component can be used as a defoaming agent.

The defoaming agent is not particularly limited and it can be suitably selected to suit to a particular application. It includes, but is not limited to, a silicon-based defoaming agent, polyether-based defoaming agent, and aliphatic acid ester-based defoaming agent. Of these, silicone-based defoaming agents are preferable to enhance the ability of braking foams. Those defoaming agents can be used alone or in combination.

Preservatives and Fungicides

The preservatives and fungicides mentioned above are not particularly limited and can be suitably selected to suit to a particular application. One specific example is 1,2-benzisothiazoline-3-one.

pH Regulator

The pH regulator is not particularly limited as long as it can adjust pH not lower than 7 and it can be suitably selected to suit to a particular application.

Specific examples include, but are not limited to, amines such as diethanol amine and triethanol amine.

Method of Detecting Substance Contained

The quantitative analysis and qualitative analysis for organic solvents, resin, coloring materials, and other components contained in ink are conducted by a method such as gas chromatography mass spectrometry (GC-MS). One of the measuring devices of GC-MS is GCMS-QP 2020NX, manufactured by Shimadzu Corporation. Water contained in ink can be measured by a known method such as quantitative analysis of the volatile components by GC-MS or mass variation by thermogravimeter-differential thermal analysis (TG-DTA).

Property of Ink

Properties of the ink of the present disclosure are not particularly limited and they can be suitably selected to suit to a particular application. The ink preferably has properties such as viscosity, surface tension, and pH in the following ranges.

The ink preferably has a viscosity of from 5 to 30 mPa·s and more preferably from 5 to 25 mPa·s at 25 degrees C. to enhance the print density, text quality, and dischargeability. Viscosity can be measured by equipment such as a rotatory viscometer, RE-80L, manufactured by TOKI SANGYO CO., LTD. The conditions for measuring viscosity are as follows:

Standard cone rotor (1°34'×R24)

Sample liquid amount: 1.2 mL

Rate of rotations: 50 rotations per minute (rpm)

25 degrees C.

Measuring time: three minutes.

The surface tension of the ink of the present disclosure is preferably 35 mN/m or less and more preferably 32 mN/m or less at 25 degrees C. because the ink suitably levels on a printing medium and the ink quickly dries.

pH of the ink of the present disclosure is preferably from 7 to 12 and more preferably from 8 to 11 to prevent corrosion of metal material brought into contact with liquid.

Ink Container

The ink of the present disclosure can be accommodated in an ink container for use in printing. In the specification, the ink container accommodating the ink of the present disclosure is also referred to as an ink accommodating container.

The ink container is not particularly limited. One of such a container is a known ink cartridge for an inkjet printer.

The ink container is readily stored and conveyed with a handle of ease and can be detachably attached to an ink cartridge and an image forming device to replenish the ink.

The ink container is not particularly limited and can be suitably selected from known containers. One of them is a container with a cap.

The form of the ink container is not particularly limited and can be suitably selected to suit to a particular application. It is preferably a cylindrical form. Further, this ink container has spiral irregularities on the inner peripheral surface, with which ink is moved to the discharging aperture in accordance with rotation. A part or all of the spiral irregularities preferably has a bellow function.

The material of the ink container is not particularly limited and it can be suitably selected to suit to a particular application. It is preferably a resin such as a polyester resin, a polyethylene resin, a polypropylene resin, a polystyrene resin, a polyvinyl chloride resin, a polyacrylic acid, a polycarbonate resin component, an ABS resin, or a polyacetal resin to achieve a good dimensional accuracy.

The size and structure of the ink container is not particularly limited and it can be suitably selected to suit to a particular application.

Image Forming Device and Image Forming Method

The image forming device of the present disclosure includes an ink container accommodating the ink of the present disclosure, a device for discharging the ink to a printing medium, and other optional devices.

The image forming method of the present disclosure includes discharging the ink of the present disclosure to a printing medium to form an image thereon and other optional processes.

Discharging Device and Discharging Process

The discharging device discharges the ink accommodated in the ink container mentioned above to a printing medium.

During the ink discharging, the ink accommodated in the ink container mentioned above is discharged to a printing medium.

The ink discharging is suitably conducted by the discharging device.

The discharging device is not particularly limited and it can be a known ink discharging device such as an inkjet device.

Other Optional Device and Other Optional Process

The other optional devices are not particularly limited and can be suitably selected to suit to a particular application. Specific examples include, but are not limited to, a pre-processing unit, a post-processing unit, a heating device, a drying device, and a device for feeding, conveying, and ejecting a printing medium.

The other optional processes are not particularly limited and they can be suitably selected to suit to a particular application. Specific examples include, but are not limited to, pre-processing, post-processing, heating, drying, and processes relating to feeding, conveying, and ejecting a printing medium The other processes are suitably conducted by the other corresponding devices.

Pre-Processing Unit and Pre-Processing Process

The pre-processing unit applies a pre-processing fluid to a printing medium before the ink is applied thereto.

In the pre-processing process, a pre-processing fluid is applied to a printing medium before the ink is applied thereto.

The pre-processing process can be suitably conducted by the pre-processing unit.

As an aspect of a pre-processing device equipped with the pre-processing unit, as in the case of the ink such as black (K), cyan (C), magenta (M), yellow (Y), and white (W), the pre-processing device further includes a liquid accommodating unit containing the pre-processing fluid mentioned above and a liquid discharging head for discharging the pre-processing fluid according to inkjet printing.

The pre-processing unit is not particularly limited and it can be suitably selected to suit to a particular application. It includes, but is not limited to, a unit that stores the pre-processing fluid in an ink container like ink and applies the pre-processing fluid to a printing medium by inkjetting, a unit utilizing blade coating, a unit utilizing roll coating, and a unit utilizing spray coating.

The pre-processing fluid contains a flocculant, an organic solvent, water, and other optional materials such as a surfactant, a defoaming agent, a pH regulator, a preservatives and fungicides, and a corrosion inhibitor.

For the organic solvent, the surfactant, the defoaming agent, the pH regulator, the preservatives and fungicides, and the corrosion inhibitor, the same materials as those for use in ink can be used. Materials for use in known processing fluid can be also used.

The flocculant is not particularly limited and it can be suitably selected to suit to a particular application. Examples include, but are not limited to, a water-soluble cationic polymer, an acid, and a polyvalent metal salt.

Post-Processing Unit and Post-Processing Process

The post-processing unit applies a post-processing fluid to a printing medium after the ink is applied thereto.

In the post-processing process, a post-processing fluid is applied to a printing medium after the ink is applied thereto.

The post-processing process is suitably conducted by the post-processing unit.

As an aspect of the post-processing device including the post-processing unit, as in the case of the ink such as black (K), cyan (C), magenta (M), yellow (Y), and white (W), the post-processing device may further include a liquid accommodating unit containing a post-processing fluid and a liquid discharging head for discharging the post-processing fluid according to inkjet printing.

The post-processing unit is not particularly limited and it can be suitably selected to suit to a particular application. It includes, but is not limited to, a unit that stores the post-processing fluid in an ink container like ink and applies the post-processing fluid to a printing medium by inkjetting, a unit utilizing blade coating, a unit utilizing roll coating, and a unit utilizing spray coating.

The post-processing fluid is not particularly limited as long as it can form a transparent layer, Materials such as an organic solvent, water, a resin, a surfactant, a defoaming agent, a pH regulator, preservatives and fungicides, and a corrosion inhibitor are suitably selected based on a necessity basis and mixed to obtain post-processing fluid. The post-processing fluid can be applied to the entire printing region formed on a printing medium or only the region on which an ink image is formed.

Heating Device and Heating Process and Drying Device and Drying Process

The heating device heats the print surface and/or the opposite surface of a printing medium.

The heating process includes heating the print surface and/or the opposite surface of a printing medium.

The heating process can be suitably conducted with the heating device.

The drying device dries the print surface and/or the opposite surface of a printing medium.

The drying process includes drying the print surface and/or the opposite surface of a printing medium.

The drying process can be suitably conducted with the drying device.

The heating device and the drying device are not particularly limited. It includes, but is not limited to a fan heater or an infra-red heater. It is possible to heat and dry a printing medium before, during, and after printing.

In addition, the image forming device and the image forming method are not limited to those for producing meaningful visible images such as text and figures with ink. The method and device include creating patterns like geometric design and 3D images.

The image forming device includes both a serial type device in which the discharging head moves and a line type device in which the discharging head is not moved, unless otherwise specified.

Furthermore, other than a desktop type printer, this image forming device includes a device capable of printing images on a wide printing medium of, for example, A0 size, and a continuous printer capable of using continuous paper reeled in a roll-like form as a printing medium.

Printing Medium

The "printing medium" in the specification means a target on which printing is conducted with the ink of the present disclosure. The printing medium refers to an item to which the ink of the present disclosure or processing fluids can be temporarily or permanently attached.

The printing medium is not particularly limited and can be suitably selected to suit to a particular application. It includes, but is not limited to, plain paper, gloss paper, special paper, cloth, film, a transparent sheet, general printing paper, or a non-permeable substrate.

The non-permeable substrate has a surface with low moisture permeability or absorbency. It includes a material having many hollow spaces inside that are not open to the outside. To be more quantitative, the substrate has a water-absorbency of 10 $mL/m^2$ or less between the initiation of contact and 30 $msec^{1/2}$ later according to Bristow's method.

The non-permeable substrate includes, but is not limited to, plastic films such as vinyl chloride resin film, polyethylene terephthalate (PET) film, polypropylene film, polyethylene film, and polycarbonate film.

The printing medium is not limited to a typical printing medium and suitably includes building materials such as wall paper, a floor material, and a tile, cloth for apparel such as T-shirts, textile, and leather. The configuration of the paths on which the printing medium is conveyed can be changed to use materials such as ceramics, glass, and metal.

Printed Matter

Items on which images are formed with the ink of the present disclosure can be defined as printed matter.

The printed matter can be obtained with the image forming device executing the image forming method.

Figure 2:
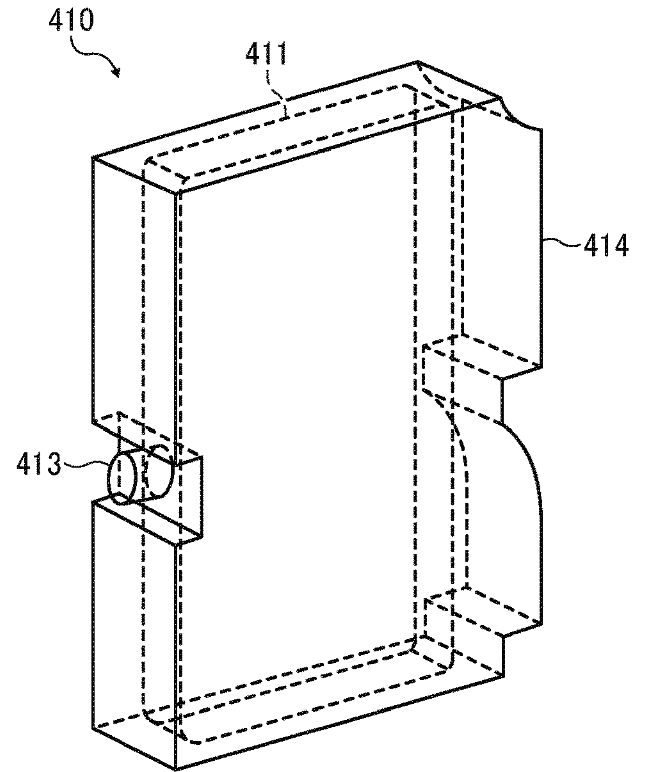
FIG. 2 is a schematic diagram illustrating an example of an ink cartridge.

An example of the image forming device of the present disclosure is described with reference to FIG. 1 and FIG. 2. FIG. 1 is a diagram illustrating a perspective view of the same device. FIG. 2 is a diagram illustrating a perspective view of a tank. An image forming device 400 is a serial image forming device. An image forming device 400 includes a mechanical unit 420 in an exterior 401. Each ink accommodating unit (ink container) 411 of each tank 410 (410*k*, 410*c*, 410*m*, and 410*y*) for each color of black (K), cyan (C), magenta (M), and yellow (Y) is made of a packaging material such as aluminum laminate film. The ink accommodating unit 411 is housed in an exterior such as a plastic container housing unit 414 and L represents liquid contained in the ink accommodating unit 411. The tank 410 is used as an ink cartridge of each color.

Each color ink is not limited to black (K), cyan (C), magenta (M), and yellow (Y) but to other color ink such as white (W) and metallic ink. Each color tank 410 and each ink accommodating unit 411 are not limited in the same manner as those.

A cartridge holder 404 is disposed on the rear side of the opening appearing when a cover 401*c* is opened. The tank 410 is detachably attached to the cartridge holder 404. This configuration enables each ink discharging outlet 413 of the tank 410 to communicate with a discharging head 434 for each color via a supplying tube 436 for each color so that the ink can be discharged from the discharging head 434 to a printing medium.

In addition, the tank 410 for each color or each ink accommodating unit 411 may be filled with a pre-processing fluid or a post-processing fluid instead of ink so that the discharging head 434 can discharge them to a printing medium.

Application Field

The ink of the present disclosure can be suitably applied to a printing device employing inkjet printing, such as a printer, facsimile machine, photocopier, multifunction peripheral (serving as a printer, a facsimile machine, and a photocopier), and solid freeform fabrication device such as a 3D printer and additive manufacturing device.

The usage of the ink of the present disclosure is not particularly limited and can be suitably selected to suit to a particular application. The ink can be applied to printed matter, a paint, a coating material, and foundation. The ink can be used to produce two-dimensional text and images and furthermore used as a material for solid fabrication for manufacturing a solid fabrication object (or solid freeform fabrication object).

The solid freeform fabrication object includes an object manufactured by repetitively coating ink. In addition, the solid freeform fabrication object includes a mold-processed product manufactured by processing a structure having a substrate such as a printing medium to which the ink is applied.

The device for manufacturing a solid freeform fabrication object can be any known device with no particular limit. For example, the device includes a container, supplying device, discharging device, drier of ink, and others.

The mold-processed product is manufactured from recorded matter or a structure having a sheet-like form and film-like form by, for example, heating drawing or punching. The mold-processed product is suitably used to produce items surface-decorated after molding such as gauges or operation panels of vehicles, office machines, electric and electronic devices, and cameras.

Backsheet for Solar Cell

The polymer having a structural unit represented by Chemical Formula 1 or the copolymer having a structural unit represented by Chemical Formula 1 and a structural unit represented by Chemical Formula 2 can be used as resin contained in the protection layer of a backsheet for solar cell.

In other words, the backsheet for solar cell of the present disclosure includes a protection layer containing titanium oxide and resin. The resin contains a polymer having a structural unit represented by Chemical Formula 1 or a copolymer having a structural unit represented by Chemical Formula 1 and a structural unit represented by Chemical Formula 2 and other optional resin B.

The backsheet for solar cell of the present disclosure can be disposed on the rear side of a solar cell module to enhance the resistance to weather to light from the side of the light receiving surface and the side of the rear side.

The protection layer is preferably disposed on a substrate film.

The substrate film is not particularly limited and can be suitably selected to suit to a particular application. Polyester film is preferable to enhance the mechanical strength, dimensional stability, and thermal stability. Polyester film mainly containing polyethylene terephthalate or polyethylene naphthalate is more preferable.

The other resin B is not particularly limited and can be suitably selected to suit to a particular application. Acrylic-based resin is preferable and acrylic-based resin cross-linkable with isocyanate is more preferable to achieve excellent mechanical strength and resistance to weather.

Method of Manufacturing Backsheet for Solar Cell

The method of manufacturing the backsheet for solar cell is not particularly limited and can be suitably selected to suit to a particular application. The backsheet can be manufactured by the following method including 1 to 4 processes.

1. The polymer or the copolymer of the present disclosure is added to an organic solvent and dissolved while being stirred to obtain a solution. A coloring material is slowly added to the solution during stirring followed by stirring again.

2. Then the resulting solution is dispersed with a dispersing device, followed by filtering with a membrane filter. The organic solvent is added as a balance to prepare a liquid for forming a protection layer.

3. The liquid obtained is applied to the surface of a substrate using a wire bar, followed by drying the liquid until it has a particular thickness to prepare a protection layer.

4. The protection layer obtained is aged to obtain a backsheet for solar cell.

The organic solvent for use in the process 1 is not particularly limited and it can be suitably selected to suit to a particular application. It includes, but is not limited to, the organic solvent specified in the Ink above and hexamethylene diisocyanate.

The coloring material for use in the process of 1 is not particularly limited and it can be suitably selected to suit to a particular application. It includes, but is not limited to, the coloring material specified in the Ink above.

The dispersing device in the process 2 is not particularly limited and it can be suitably selected to suit to a particular application. A specific example is big rotor BR-2, manufactured by AS ONE Corporation. The condition of the dispersion is not particularly limited and it can be suitably selected to suit to a particular application. For example, the dispersion can be conducted at a rate of rotation of 90 rpm for a treatment time of five days.

The substrate in the process 3 is not particularly limited and it can be suitably selected to suit to a particular application. One of such a substrate is the printing medium mentioned in the Image Forming Device and Image Forming Method above.

The “particular thickness” in the process 3 is not particularly limited and it can be suitably selected to suit to a particular application. It can be, for example, 2 μm.

The drying condition in the process 3 is not particularly limited and it can be suitably selected to suit to a particular application. For example, the liquid can be dried at a temperature of 150 degrees C. for five minutes.

The condition of the aging in the process 4 is not particularly limited and it can be suitably selected to suit to a particular application. For example, the backsheet can be aged at 50 degrees C. for three days.

The terms of image forming, recording, and printing in the specification represent the same meaning.

Also, printing media, media, and substrates in the present disclosure have the same meaning unless otherwise specified.

The terms of image forming, recording, and printing in the present disclosure represent the same meaning.

Also, recording media, media, and print substrates in the present disclosure have the same meaning unless otherwise specified.

Having generally described preferred embodiments of this disclosure, further understanding can be obtained by reference to certain specific examples which are provided herein for the purpose of illustration only and are not intended to be limiting. In the descriptions in the following examples, the numbers represent weight ratios in parts, unless otherwise specified.

EXAMPLES

Next, the present disclosure is described in detail with reference to Examples but is not limited thereto. In Examples, “parts” and “percent” are “parts by mass” and “percent by mass” unless otherwise specified.

The molecular weight of the polymers or copolymers obtained in Synthesis Examples, Examples, and Comparative Examples were measured by the following method under the following condition.

Measuring of Molecular Weight

The molecular weight of the polymer and the copolymer was measured by gel permeation chromatography (GPC) under the following device and conditions:

Device: GPC-8020 (manufactured by TOSOH CORPORATION)

Column: TSK G2000 HXL and G4000 HXL (manufactured by TOSOH CORPORATION)

Temperature: 40 degrees C.

Solvent: Tetrahydrofuran (THF)

Flow speed: 1.0 mL/minute

A total of 1 mL of a polymer or a copolymer having a concentration of 0.5 percent by mass was infused into the column. Using the molecular weight calibration curve obtained based on a simple dispersion polystyrene standard sample from the molecular weight distribution of the polymer or the copolymer measured under the conditions specified above, the number average molecular weight Mn and the weight average molecular weight Mw of the polymer or the copolymer were calculated.

Synthesis of Monomer

Synthesis Example 1 of Monomer

A total of 4.81 g (80 mmol) of 1,2-ethylene diamine (manufactured by TOKYO CHEMICAL INDUSTRY CO., LTD.) was placed in a 100 mL four-necked flask. A solution in which 3.92 g (16 mmol) of 2-bromoethyl phosphonic acid diethyl ester (manufactured by TOKYO CHEMICAL INDUSTRY CO., LTD.) was dissolved in 20 mL of ethanol (EtOH), manufactured by Kanto Chemical Co., Inc.) was added dropwise to the flask in 30 minutes while being stirred in a nitrogen atmosphere. After being stirred at room temperature for 12 hours, the solvent was distilled away. A total of 30 mL of ethyl acetate (manufactured by Kanto Chemical Co., Inc.) was added to the residual, followed by stirring for five minutes to separate a precipitate by filtering. The precipitate was purified by a column chromatography of silica gel using dichloromethane (MDC)/methanol (MeOH) at a volume ratio of from 10:0 to 9:1 (manufactured by Kanto Chemical Co., Inc.) as eluent to obtain 2.67 g of diethyl(2-N-(2-aminoethyl)aminoethyl)phosphonic acid diethyl ester M1a.

Next, 10 mL of tetrahydrofuran (THF, manufactured by Kanto Chemical Co., Inc.) and 2.25 g (10 mmol) of M1a was added to a 50 mL three-necked flask, followed by cooling with iced water in a nitrogen atmosphere. To the resulting substance, a solution in which 2.02 g (10 mmol) of 3-isoproppenyl-α,α-dimethyl benzyl isocyanate (manufactured by TOKYO CHEMICAL INDUSTRY CO., LTD.) was dissolved in 20 mL of THF was slowly added in five minutes, followed by stirring at 0 degrees C. to room temperature for 15 hours. The solvent was distilled away and the residual was purified by a column chromatography of silica gel using MDC/(MeOH) at a volume ratio of 8:2 (manufactured by Kanto Chemical Co., Inc.) as eluent to obtain 3.78 g of 2-(2-(3-(2-(3-prop-1-en-2-yl)phenyl)propane-2-yl)ureido)ethylamino)ethyl phosphonic acid diethyl ester M1b.

Then 2.13 g (5 mmol) of M1b was placed in a 100 mL round-bottom flask and 10 mL of super dehydrated MDC was added thereto to dissolve M1b. A solution in which 3.06 g (20 mmol) of trimethylsilyl bromide was dissolved in 10 mL of super-dehydrated MDC was added to the resulting solution obtained in a nitrogen atmosphere, followed by stirring for 24 hours. Extra trimethylsilyl bromide was purged of the obtained solution at room temperature under a reduced pressure to obtain 2.45 g of a white solid. A total of 50 mL of MeOH was added in a nitrogen atmosphere followed by stirring for 24 hours. The volatile component was distilled away at room temperature under a reduced pressure. The residual obtained was rinsed with 30 mL of hexane (manufactured by Kanto Chemical Co., Inc.) twice to obtain 1.69 g of 2-(2-(3-(2-(3-prop-1-en-2-yl)phenyl)propane-2-yl)ureido) ethylamino)ethyl phosphonic acid M1.

The structure of the monomer M1 obtained is illustrated below.

(M1)

Monomer M1

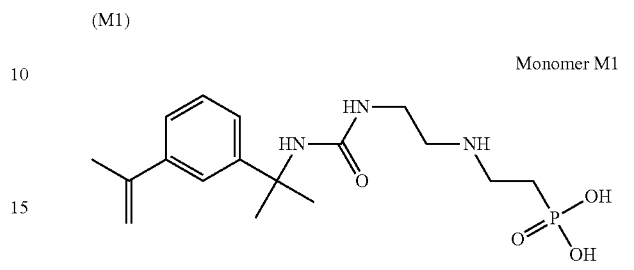

Synthesis Example 2 of Monomer

A total of 7.05 g (80 mmol) of 1,4-diamino butane (manufactured by TOKYO CHEMICAL INDUSTRY CO., LTD.) was placed in a 100 mL four-necked flask. A solution in which 3.92 g (16 mmol) of 2-bromoethyl phosphonic acid diethyl ester (manufactured by TOKYO CHEMICAL INDUSTRY CO., LTD.) was dissolved in 20 mL of EtOH was added dropwise to the flask in 30 minutes while being stirred in a nitrogen atmosphere. After being stirred at room temperature for 12 hours, the solvent was distilled away. A total of 30 mL of ethyl acetate was added to the residual, followed by stirring for five minutes to separate a precipitate by filtering. The precipitate was purified by a column chromatography of silica gel using dichloromethane (MDC)/methanol (MeOH) at a volume ratio of from 10:0 to 9:1 as eluent to obtain 3.07 g of diethyl(2-N-(4-aminobutyl) aminoethyl)phosphonic acid diethyl ester (M2a).

Next, 10 mL of THF and 2.53 g (10 mmol) of M2a was added to a 50 mL three-necked flask, followed by cooling with iced water in a nitrogen atmosphere. To the resulting substance, a solution in which 2.02 g (10 mmol) of 3-isoproppenyl-α,α-dimethyl benzyl isocyanate (manufactured by TOKYO CHEMICAL INDUSTRY CO., LTD.) was dissolved in 20 mL of THE was slowly added in five minutes, followed by stirring at 0 degrees C. to room temperature for 15 hours. The solvent was distilled away and the residual was purified by a column chromatography of silica gel using MDC/(MeOH) at a volume ratio of 8:2 as eluent to obtain 3.86 g of 2-(2-(3-(2-(3-prop-1-en-2-yl) phenyl)propane-2-yl)ureido) butylamino)ethyl phosphonic acid diethyl ester (M2b).

Then 2.27 g (5 mmol) of M2b was placed in a 100 mL round-bottom flask and 10 mL of super dehydrated MDC was added thereto to dissolve M2b. A solution in which 3.06 g (20 mmol) of trimethylsilyl bromide was dissolved in 10 mL of super-dehydrated MDC was added to the solution obtained in a nitrogen atmosphere, followed by stirring for 24 hours. Extra trimethylsilyl bromide was purged of the obtained solution at room temperature under a reduced pressure to obtain 2.55 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice to obtain 1.77 g of 2-(4-(3-(2-(3-prop-1-en-2-yl)phenyl)propane-2-yl)ureido) butylamino)ethyl phosphonic acid (M2).

The structure of the monomer (M2) obtained is illustrated below.

(M2)

Monomer M2

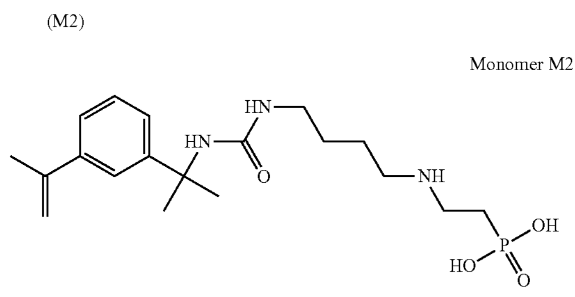

Synthesis Example 3 of Monomer

A total of 20 mL of EtOH was placed in a 100 mL four-necked flask and 11.54 g (80 mmol) of 1,8-diaminoocta (manufactured by TOKYO CHEMICAL INDUSTRY CO., LTD.) was dissolved therein. A solution in which 3.92 g (16 mmol) of 2-bromoethyl phosphonic acid diethyl ester was dissolved in 20 mL of EtOH was added dropwise to the flask in 30 minutes while being stirred in a nitrogen atmosphere. After being stirred at room temperature for 12 hours, the solvent was distilled away. A total of 50 mL of ethyl acetate was added to the residual, followed by stirring for five minutes to separate a precipitate by filtering. The precipitate was purified by a column chromatography of silica gel using dichloromethane (MDC)/methanol (MeOH) at a volume ratio of from 10:0 to 9:1 as eluent to obtain 5.56 g of diethyl(2-N-(8-aminobutyl)aminoethyl)phosphonic acid diethyl ester M3a.

Next, 10 mL of THF and 3.10 g (10 mmol) of M3a was added to a 50 mL three-necked flask, followed by cooling with iced water in a nitrogen atmosphere. To the resulting substance, a solution in which 2.02 g (10 mmol) of 3-isopropenyl-α,α-dimethyl benzyl isocyanate (manufactured by TOKYO CHEMICAL INDUSTRY CO., LTD.) was dissolved in 20 mL of THE was slowly added in five minutes, followed by stirring at 0 degrees C. to room temperature for 15 hours. The solvent was distilled away and the residual was purified by a column chromatography of silica gel using MDC/(MeOH) at a volume ratio of 8:2 as eluent to obtain 4.43 g of 2-(8-(3-(2-(3-prop-1-en-2-yl) phenyl)propane-2-yl)ureido) octylamino)ethyl phosphonic acid diethyl ester M3b.

Then 2.55 g (5 mmol) of M3b was placed in a 100 mL round-bottom flask and 10 mL of super dehydrated MDC was added thereto to dissolve M3b. A solution in which 3.06 g (20 mmol) of trimethylsilyl bromide was dissolved in 10 mL of super-dehydrated MDC was added to the solution obtained in a nitrogen atmosphere, followed by stirring for 24 hours. Extra trimethylsilyl bromide was purged of the obtained solution at room temperature under a reduced pressure to obtain 2.83 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice to obtain 2.02 g of 2-(8-(3-(2-(3-prop-1-en-2-yl)phenyl)propane-2-yl)ureido) octylamino)ethyl phosphonic acid M3.

The structure of the monomer M3 obtained is illustrated below.

(M3)

Monomer M3

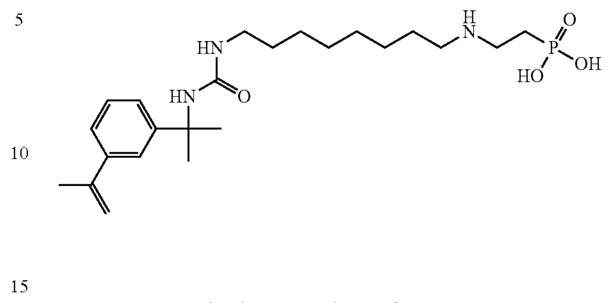

Synthesis Example 4 of Monomer

A total of 20 mL of EtOH was placed in a 100 mL four-necked flask and 16.03 g (80 mmol) of 1,12-diaminododecane (manufactured by TOKYO CHEMICAL INDUSTRY CO., LTD.) was dissolved therein. A solution in which 3.92 g (16 mmol) of 2-bromoethyl phosphonic acid diethyl ester was dissolved in 20 mL of EtOH was added dropwise to the flask in 30 minutes while being stirred in a nitrogen atmosphere. After being stirred at room temperature for 12 hours, the solvent was distilled away. A total of 50 mL of ethyl acetate was added to the residual, followed by stirring for five minutes to separate a precipitate by filtering. The precipitate was purified by a column chromatography of silica gel using dichloromethane (MDC)/methanol (MeOH) at a volume ratio of 8:2 as eluent to obtain 6.55 g of diethyl(2-N-(12-aminododecyl)aminoethyl)phosphonic acid diethyl ester M4a.

Next, 10 mL of THF and 3.10 g (10 mmol) of M4a was added to a 50 mL three-necked flask, followed by cooling with iced water in a nitrogen atmosphere. To the resulting substance, a solution in which 2.02 g (10 mmol) of 3-isoproppenyl-α,α-dimethyl benzyl isocyanate (manufactured by TOKYO CHEMICAL INDUSTRY CO., LTD.) was dissolved in 20 mL of THE was slowly added in five minutes, followed by stirring at 0 degrees C. to room temperature for 15 hours. The solvent was distilled away and the residual was purified by a column chromatography of silica gel using MDC/(MeOH) at a volume ratio of 8:2 as eluent to obtain 4.48 g of 2-(12-(3-(2-(3-prop-1-en-2-yl) phenyl)propane-2-yl)ureido) dodecylamino)ethyl phosphonic acid diethyl ester M4b.

Then 2.83 g (5 mmol) of M4b was placed in a 100 mL round-bottom flask and 10 mL of super dehydrated MDC was added thereto to dissolve M4b. A solution in which 3.06 g (20 mmol) of trimethylsilyl bromide was dissolved in 10 mL of super-dehydrated MDC was added to the solution obtained in a nitrogen atmosphere, followed by stirring for 24 hours. Extra trimethylsilyl bromide was purged of the obtained solution at room temperature under a reduced pressure to obtain 3.15 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice to obtain 2.35 g of 2-(12-(3-(2-(3-prop-1-en-2-yl)phenyl)propans-2-yl)ureido) dodecylamino)ethyl phosphonic acid M4.

The structure of the monomer M4 obtained is illustrated below.

(M4)

Monomer M4

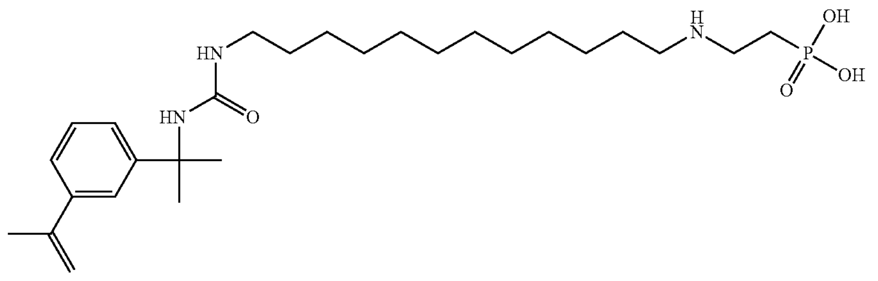

Synthesis Example 5 of Monomer

A total of 20 mL of EtOH was placed in a 100 mL four-necked flask and 9.30 g (80 mmol) of 1,6-diaminohexane (manufactured by TOKYO CHEMICAL INDUSTRY CO., LTD.) was dissolved therein. A solution in which 3.92 g (16 mmol) of 2-bromoethyl phosphonic acid diethyl ester was dissolved in 20 mL of EtOH was added dropwise to the flask in 30 minutes while being stirred in a nitrogen atmosphere. After being stirred at room temperature for 12 hours, the solvent was distilled away. A total of 50 mL of ethyl acetate was added to the residual, followed by stirring for five minutes to separate a precipitate by filtering. The precipitate was purified by a column chromatography of silica gel using dichloromethane (MDC)/methanol (MeOH) at a volume ratio of from 10:0 to 9:1 as eluent to obtain 6.55 g of diethyl(2-N-(6-aminohexyl)aminoethyl)phosphonic acid diethyl ester (M5a).

Next, 10 mL of THF and 2.82 g (10 mmol) of M5a was added to a 50 mL three-necked flask, followed by cooling with iced water in a nitrogen atmosphere. To the resulting substance, a solution in which 1.56 g (10 mmol) of 2-isocyanatoethyl methacrylate (manufactured by TOKYO CHEMICAL INDUSTRY CO., LTD.) was dissolved in 20 mL of THE was slowly added in five minutes, followed by stirring at 0 degrees C. to room temperature for 15 hours. After distilling away the solvent, the residue was purified by silica gel column chromatography with a solvent mixture of MDC/MeOH at a volume ratio of 8:2 as eluent to obtain 3.14 g of monomer precursor M5b.

Then 2.18 g (5 mmol) of the monomer precursor M5b was placed in a 100 mL round-bottom flask and 10 mL of super dehydrated MDC was added thereto to dissolve M5b. A solution in which 3.06 g (20 mmol) of trimethylsilyl bromide was dissolved in 10 mL of super-dehydrated MDC was added to the solution obtained in a nitrogen atmosphere, followed by stirring for 24 hours. Extra trimethylsilyl bromide was purged of the obtained solution at room temperature under a reduced pressure to obtain 2.45 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.68 g of monomer M5.

The structures of the monomer precursor M5b and the monomer M5 obtained are illustrated below.

Monomer Precursor M5b

Monomer M5

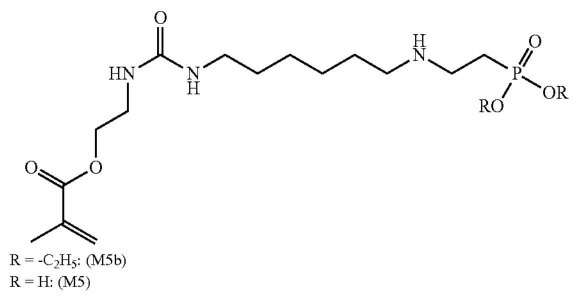

R = $-C_2H_5$: (M5b)
R = H: (M5)

Synthesis Example 6 of Monomer

A total of 20 mL of EtOH was placed in a 100 mL four-necked flask and 2.25 g (19 mmol) of 6-amino-1-hexanol (manufactured by TOKYO CHEMICAL INDUSTRY CO., LTD.) was dissolved therein. A solution in which 3.92 g (16 mmol) of 2-bromoethyl phosphonic acid diethyl ester was dissolved in 20 mL of EtOH was added dropwise to the flask in 30 minutes while being stirred in a nitrogen atmosphere. After being stirred at room temperature for 12 hours, the solvent was distilled away. The residual was purified by a column chromatography of silica gel using dichloromethane (MDC)/methanol (MeOH) at a volume ratio of from 10:0 to 9:1 as eluent to obtain 3.36 g of diethyl(2-(6-hydroxyhexyl amino)ethyl phosphonic acid diethyl ester (M6a).

Next, 10 mL of THF and 2.83 g (10 mmol) of M6a was added to a 50 mL three-necked flask, followed by cooling with iced water in a nitrogen atmosphere. To the resulting substance, a solution in which 1.56 g (10 mmol) of 2-isocyanatoethyl methacrylate (manufactured by TOKYO CHEMICAL INDUSTRY CO., LTD.) was dissolved in 20 mL of THE was slowly added in five minutes, followed by stirring at 0 degrees C. to room temperature for 15 hours. After distilling away the solvent, the residue was purified by silica gel column chromatography with a solvent mixture of MDC/MeOH at a volume ratio of 8:2 as eluent to obtain 3.23 g of monomer precursor M6b.

Then 2.18 g (5 mmol) of the monomer precursor M6b was placed in a 100 mL round-bottom flask and 10 mL of super dehydrated MDC was added thereto to dissolve M6b. A solution in which 3.06 g (20 mmol) of trimethylsilyl bromide was dissolved in 10 mL of super-dehydrated MDC was added to the solution obtained in a nitrogen atmosphere, followed by stirring for 24 hours. Extra trimethylsilyl bromide was purged of the obtained solution at room temperature under a reduced pressure to obtain 2.48 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.69 g of monomer M6.

The structure of the monomer precursor M6b and the monomer M6 obtained are illustrated below.

Monomer Precursor M6b

Monomer M6

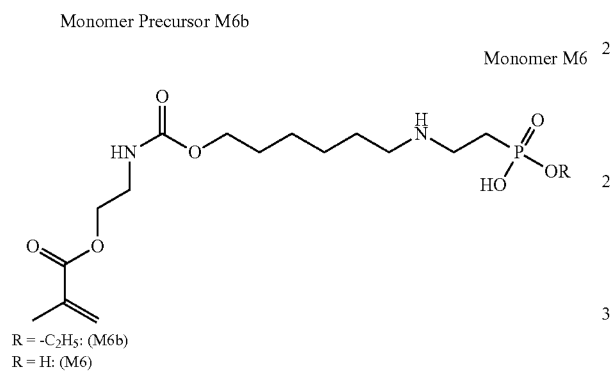

R = $-C_2H_5$: (M6b)
R = H: (M6)

Synthesis Example 7 of Monomer

Next, 10 mL of THF and 2.80 g (10 mmol) of M5a was added to a 50 mL three-necked flask, followed by cooling with iced water in a nitrogen atmosphere. To the resulting substance, a solution in which 1.41 g (10 mmol) of 2-isocyanato ethyl acrylate (manufactured by TOKYO CHEMICAL INDUSTRY CO., LTD.) was dissolved in 20 mL of THF was slowly added in five minutes, followed by stirring at 0 degrees C. to room temperature for 15 hours. After distilling away the solvent, the residue was purified by silica gel column chromatography with a solvent mixture of MDC/MeOH at a volume ratio of 8:2 as eluent to obtain 3.15 g of monomer precursor M7b.

Then 2.11 g (5 mmol) of the monomer precursor M7b was placed in a 100 mL round-bottom flask and 10 mL of super dehydrated MDC was added thereto to dissolve M7b. A solution in which 3.06 g (20 mmol) of trimethylsilyl bromide was dissolved in 10 mL of super-dehydrated MDC was added to the solution obtained in a nitrogen atmosphere, followed by stirring for 24 hours. Extra trimethylsilyl bromide was purged of the obtained solution at room temperature under a reduced pressure to obtain 2.39 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.66 g of monomer M7.

The structure of the monomer precursor M7b and the monomer M7 obtained are illustrated below.

Monomer Precursor M7b

Monomer M7

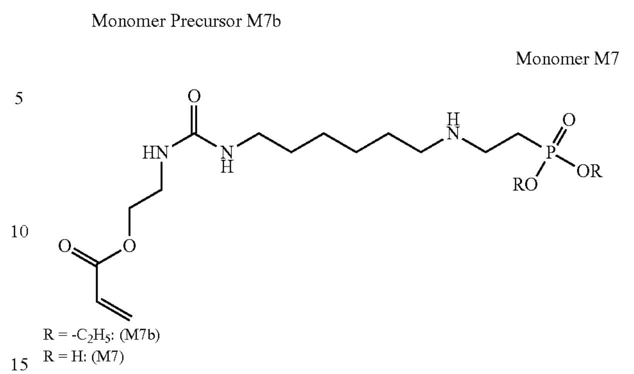

R = $-C_2H_5$: (M7b)
R = H: (M7)

Synthesis Example 8 of Monomer

Next, 10 mL of THF and 2.81 g (10 mmol) of M6a was added to a 50 mL three-necked flask, followed by cooling with iced water in a nitrogen atmosphere. To the resulting substance, a solution in which 1.41 g (10 mmol) of 2-isocyanate ethyl acrylate (manufactured by TOKYO CHEMICAL INDUSTRY CO., LTD.) was dissolved in 20 mL of THF was slowly added in five minutes, followed by stirring at 0 degrees C. to room temperature for 15 hours. After distilling away the solvent, the residue was purified by silica gel column chromatography with a solvent mixture of MDC/MeOH at a volume ratio of 8:2 as eluent to obtain 3.23 g of monomer precursor M8b.

Then 2.11 g (5 mmol) of the monomer precursor M8b was placed in a 100 mL round-bottom flask and 10 mL of super dehydrated MDC was added thereto to dissolve M8b. A solution in which 3.06 g (20 mmol) of trimethylsilyl bromide was dissolved in 10 mL of super-dehydrated MDC was added to the solution obtained in a nitrogen atmosphere, followed by stirring for 24 hours. Extra trimethylsilyl bromide was purged of the obtained solution at room temperature under a reduced pressure to obtain 2.41 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.68 g of monomer M8.

The structure of the monomer precursor M8b and the monomer M8 obtained are illustrated below.

Monomer Precursor M8b

Monomer M8

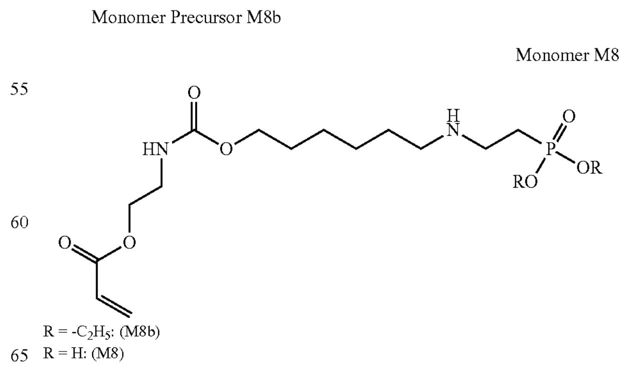

R = $-C_2H_5$: (M8b)
R = H: (M8)

Synthesis Example 9 of Monomer

Next, 10 mL of THF and 2.80 g (10 mmol) of M5a was added to a 50 mL three-necked flask, followed by cooling with iced water in a nitrogen atmosphere. To the resulting substance, a solution in which 1.54 g (10 mmol) of N-(3-isocyanate propyl) acryl amide (manufactured by Chemieliva Pharmaceutical Co., Ltd.) was dissolved in 20 mL of THE was slowly added in five minutes, followed by stirring at 0 degrees C. to room temperature for 15 hours. After distilling away the solvent, the residue was purified by silica gel column chromatography with a solvent mixture of MDC/MeOH at a volume ratio of 8:2 as eluent to obtain 3.15 g of monomer precursor M9b.

Then 2.11 g (5 mmol) of the monomer precursor M9b was placed in a 100 mL round-bottom flask and 10 mL of super dehydrated MDC was added thereto to dissolve M9b. A solution in which 3.06 g (20 mmol) of trimethylsilyl bromide was dissolved in 10 mL of super-dehydrated MDC was added to the solution obtained in a nitrogen atmosphere, followed by stirring for 24 hours. Extra trimethylsilyl bromide was purged of the obtained solution at room temperature under a reduced pressure to obtain 2.39 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.66 g of monomer M9.

The structure of the monomer precursor M9b and the monomer M9 obtained are illustrated below.

Monomer Precursor M9b

Monomer M9

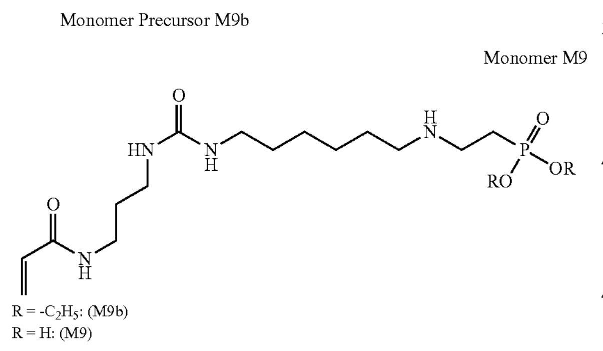

R = $-C_2H_5$: (M9b)
R = H: (M9)

Synthesis Example 10 of Monomer

Next, 10 mL of THF and 2.81 g (10 mmol) of M6a was added to a 50 mL three-necked flask, followed by cooling with iced water in a nitrogen atmosphere. To the resulting substance, a solution in which 1.54 g (10 mmol) of N-(3-isocyanate propyl) acryl amide (manufactured by Chemieliva Pharmaceutical Co., Ltd.) was dissolved in 20 mL of THE was slowly added in five minutes, followed by stirring at 0 degrees C. to room temperature for 15 hours. After distilling away the solvent, the residue was purified by silica gel column chromatography with a solvent mixture of MDC/MeOH at a volume ratio of 8:2 as eluent to obtain 3.23 g of monomer precursor M10b.

Then 2.18 g (5 mmol) of the monomer precursor M10b was placed in a 100 mL round-bottom flask and 10 mL of super dehydrated MDC was added thereto to dissolve M10b. A solution in which 3.06 g (20 mmol) of trimethylsilyl bromide was dissolved in 10 mL of super-dehydrated MDC was added to the solution obtained in a nitrogen atmosphere, followed by stirring for 24 hours. Extra trimethylsilyl bromide was purged of the obtained solution at room temperature under a reduced pressure to obtain 2.47 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.66 g of monomer M10.

The structure of the monomer precursor M10b and the monomer M10 obtained are illustrated below.

Monomer Precursor M10b

Monomer M10

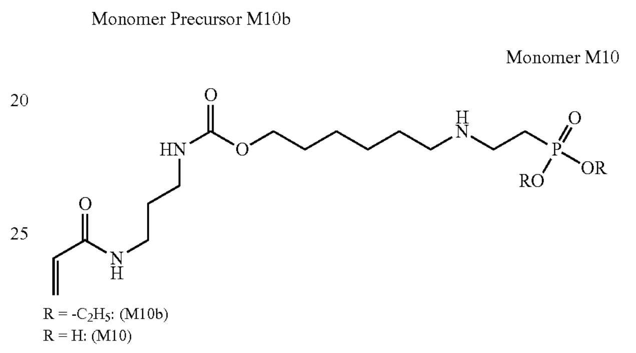

R = $-C_2H_5$: (M10b)
R = H: (M10)

Synthesis Example 11 of Monomer

Next, 10 mL of THF and 2.66 g (10 mmol) of M5a was added to a 50 mL three-necked flask, followed by cooling with iced water in a nitrogen atmosphere. To the resulting substance, a solution in which 1.85 g (10 mmol) of 2-(2-isocyanate ethoxy) ethyl acrylate (manufactured by FCH Group) was dissolved in 20 mL of THE was slowly added in five minutes, followed by stirring at 0 degrees C. to room temperature for 15 hours. After distilling away the solvent, the residue was purified by silica gel column chromatography with a solvent mixture of MDC/MeOH at a volume ratio of 8:2 as eluent to obtain 3.72 g of monomer precursor M11b.

Then 2.33 g (5 mmol) of the monomer precursor M11b was placed in a 100 mL round-bottom flask and 10 mL of super dehydrated MDC was added thereto to dissolve M11b. A solution in which 3.06 g (20 mmol) of trimethylsilyl bromide was dissolved in 10 mL of super-dehydrated MDC was added to the solution obtained in a nitrogen atmosphere, followed by stirring for 24 hours. Extra trimethylsilyl bromide was purged of the obtained solution at room temperature under a reduced pressure to obtain 2.66 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.87 g of monomer M11.

The structure of the monomer precursor M11b and the monomer M11 obtained are illustrated below.

Monomer Precursor M11b

Monomer M11

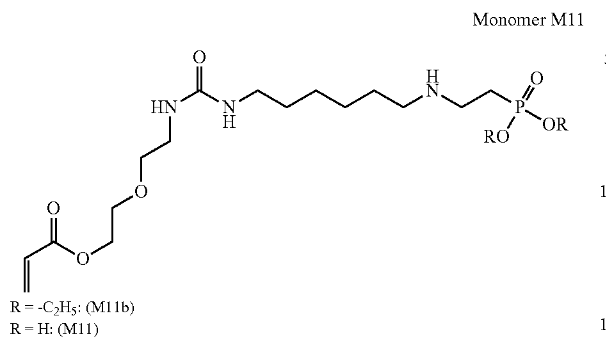

R = $-C_2H_5$: (M11b)
R = H: (M11)

Synthesis Example 12 of Monomer

Next, 10 mL of THF and 2.67 g (10 mmol) of M6a was added to a 50 mL three-necked flask, followed by cooling with iced water in a nitrogen atmosphere. To the resulting substance, a solution in which 1.85 g (10 mmol) of 2-(2-isocyanate ethoxy) ethyl acrylate (manufactured by FCH Group) was dissolved in 20 mL of THE was slowly added in five minutes, followed by stirring at 0 degrees C. to room temperature for 15 hours. After distilling away the solvent, the residue was purified by silica gel column chromatography with a solvent mixture of MDC/MeOH at a volume ratio of 8:2 as eluent to obtain 3.65 g of monomer precursor M12b.

Then 2.33 g (5 mmol) of the monomer precursor M12b was placed in a 100 mL round-bottom flask and 10 mL of super dehydrated MDC was added thereto to dissolve M12b. A solution in which 3.06 g (20 mmol) of trimethylsilyl bromide was dissolved in 10 mL of super-dehydrated MDC was added to the solution obtained in a nitrogen atmosphere, followed by stirring for 24 hours. Extra trimethylsilyl bromide was purged of the obtained solution at room temperature under a reduced pressure to obtain 2.61 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.89 g of monomer M12.

The structure of the monomer precursor M12b and the monomer M12 obtained are illustrated below.

Monomer Precursor M12b

Monomer M12

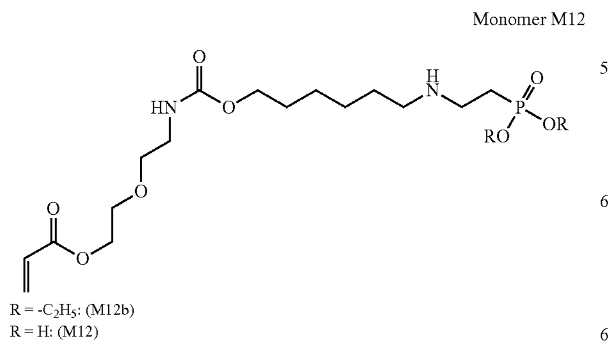

R = $-C_2H_5$: (M12b)
R = H: (M12)

Synthesis Example 13 of Monomer

A total of 6.00 g (20 mmol) of ethylene-1,1-diylbis phosphonic acid tetraethyl ester (manufactured by Apollo Scientific Ltd.), 0.72 g (2 mmol) of trifluoromethane copper (II) sulphonate (manufactured by Sigma-Aldrich Corporation), and 4.14 g (30 mmol) of 4-hydroxy phenyl boronate (manufactured by TOKYO CHEMICAL INDUSTRY CO., LTD.) were placed in a 100 mL flask and 50 mL of dehydrated toluene (manufactured by Kanto Chemical Co., Inc.) was added thereto. The liquid mixture obtained was heated to 70 degrees C., stirred for 18 hours, and cooled down to room temperature, followed by diluted with 100 mL of dichloromethane (manufactured by Kanto Chemical Co., Inc.). The diluting liquid was extracted using a saturated aqueous solution of saturated ethylene diamine tetraacetic acid (manufactured by TOKYO CHEMICAL INDUSTRY CO., LTD.), followed by rinsing with water to isolate the organic phase. After distilling away the solvent, the residue was purified by silica gel column chromatography with a solvent mixture of acetone/hexane at a volume ratio of from 4:6 to 5:5 as eluent to obtain 5.66 g of monomer precursor M13a.

One hundred mL of methylethyl ketone (manufactured by Kanto Chemical Co., Inc.) was placed in a 200 mL flask. A total of 3.94 g (10 mmol) of the monomer precursor M13a, 2.72 g (15 mmol) of 6-bromo-1-hexanol (manufactured by TOKYO CHEMICAL INDUSTRY CO., LTD.), and 2.77 g (20 mmol) of potassium carbonate (manufactured by Kanto Chemical Co., Inc.) were added to the flask, then held at reflux for 12 hours. Subsequent to cooling down to room temperature, the substance obtained was filtered and the filtrate was condensed. The residue was purified by silica gel column chromatography with a solvent mixture of MDC/MeOH at a volume ratio of from 98:2 to 90:10 as eluent to obtain 3.22 g of monomer precursor M13b.

The structure of the monomer precursor M13a and the monomer precursor M13b obtained are illustrated below.

Monomer Precursor M13a
Monomer Precursor M13b

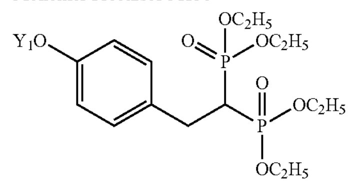

(M13a) : $Y_1$ = -H
M(13b) : $Y_1$ = $-(CH_2)_6OH$

Next, 20 mL of super dehydrated MDC was placed in a 100 mL flask and thereafter 2.47 g (5 mmol) of the monomer precursor M13b and 0.016 g (0.025 mmol) of dibutyltin dilaurate (manufactured by TOKYO CHEMICAL INDUSTRY CO., LTD.) was added to the flask, followed by cooling with iced water in a nitrogen atmosphere. To the resulting substance, a solution in which 2.01 g (10 mmol) of 3-isopropenyl-α,α-dimethyl benzyl isocyanate (manufactured by TOKYO CHEMICAL INDUSTRY CO., LTD.) was slowly added in 10 minutes, followed by stirring at 0 degrees C. to room temperature for 12 hours. After distilling away the solvent, the residue was purified by silica gel column chromatography with a solvent mixture of MDC/MeOH at a volume ratio of 8:2 as eluent to obtain 2.56 g of monomer precursor M13c.

Then 1.39 g (2 mmol) of the monomer precursor M13c was placed in a 100 mL round-bottom flask and 20 mL of super dehydrated MDC was added thereto to dissolve M13c. A total of 2.45 g (16 mmol) of Trimethylsilyl bromide was added to the flask in a nitrogen atmosphere, followed by stirring for 24 hours. Extra trimethylsilyl bromide was purged of the obtained solution at room temperature under a reduced pressure to obtain 1.71 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.12 g of monomer M13.

The structure of the monomer precursor M13c and the monomer M13 obtained are illustrated below.

Monomer Precursor M13c

Monomer M13

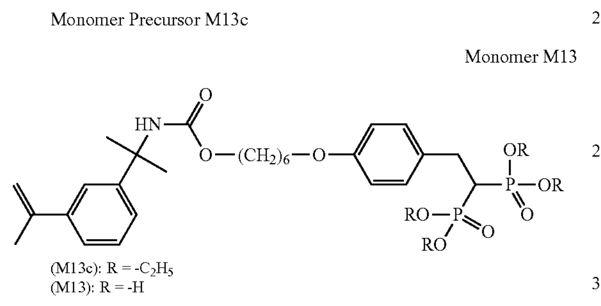

(M13c): R = $-C_2H_5$
(M13): R = -H

Synthesis Example 14 of Monomer

A total of 20 mL of super dehydrated MDC was placed in a 100 mL flask and thereafter 2.47 g (5 mmol) of the monomer precursor M13b and 0.016 g (0.025 mmol) of dibutyltin dilaurate was added to the flask, followed by cooling with iced water in a nitrogen atmosphere. To the resulting substance, 1.55 g (10 mmol) of 2-isocyanato ethyl methacrylate (manufactured by TOKYO CHEMICAL INDUSTRY CO., LTD.) was slowly added to the flask in five minutes, followed by stirring at 0 degrees C. to room temperature for 12 hours. After distilling away the solvent, the residue was purified by silica gel column chromatography with a solvent mixture of MDC/MeOH at a volume ratio of 8:2 as eluent to obtain 2.55 g of monomer precursor M14c.

Then 1.30 g (2 mmol) of the monomer precursor M14c was placed in a 100 mL round-bottom flask and 20 mL of super dehydrated MDC was added thereto to dissolve M14c. A total of 2.45 g (16 mmol) of trimethylsilyl bromide was added to the flask in a nitrogen atmosphere, followed by stirring for 24 hours. Extra trimethylsilyl bromide was purged of the obtained solution at room temperature under a reduced pressure to obtain 1.60 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.01 g of monomer M14.

The structure of the monomer precursor M14c and the monomer M14 obtained are illustrated below.

Monomer Precursor M14c

Monomer M14

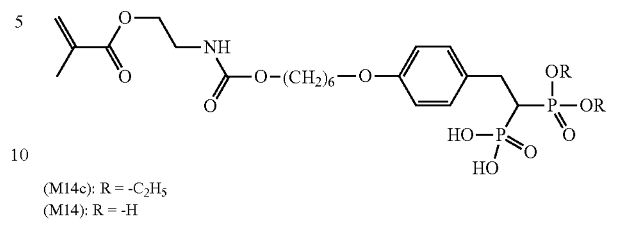

(M14c): R = $-C_2H_5$
(M14): R = -H

Synthesis Example 15 of Monomer

A total of 20 mL of super dehydrated MDC was placed in a 100 mL flask and thereafter 2.47 g (5 mmol) of the monomer precursor M13b and 0.016 g (0.025 mmol) of dibutyltin dilaurate was added to the flask, followed by cooling with iced water in a nitrogen atmosphere. To the resulting substance, 1.41 g (10 mmol) of 2-isocyanato ethyl acrylate (manufactured by TOKYO CHEMICAL INDUSTRY CO., LTD.) was slowly added to the flask in five minutes, followed by stirring at 0 degrees C. to room temperature for 12 hours. After distilling away the solvent, the residue was purified by silica gel column chromatography with a solvent mixture of MDC/MeOH at a volume ratio of 8:2 as eluent to obtain 2.44 g of monomer precursor M15c.

Then 1.30 g (2 mmol) of the monomer precursor M15c was placed in a 100 mL round-bottom flask and 20 mL of super dehydrated MDC was added thereto to dissolve M15c. A total of 2.45 g (16 mmol) of trimethylsilyl bromide was added to the flask in a nitrogen atmosphere, followed by stirring for 24 hours. Extra trimethylsilyl bromide was purged of the obtained solution at room temperature under a reduced pressure to obtain 1.59 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.00 g of monomer M15.

The structure of the monomer precursor M15c and the monomer M15 obtained are illustrated below.

Monomer Precursor M15c

Monomer M15

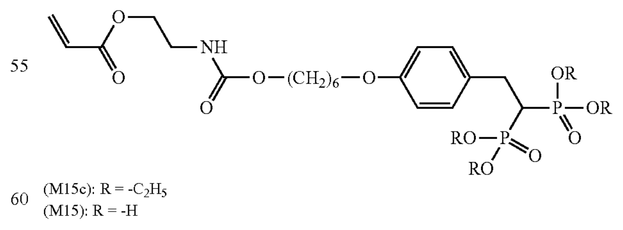

(M15c): R = $-C_2H_5$
(M15): R = -H

Synthesis Example 16 of Monomer

A total of 20 mL of super dehydrated MDC was placed in a 100 mL flask and thereafter 2.47 g (5 mmol) of the monomer precursor M13b and 0.016 g (0.025 mmol) of dibutyltin dilaurate was added to the flask, followed by cooling with iced water in a nitrogen atmosphere. To the resulting substance, 1.54 g (10 mmol) of N-(3-isocyanate propyl) acryl amide (manufactured by Chemieliva Pharmaceutical Co., Ltd.) was slowly added in five minutes, followed by stirring at 0 degrees C. to room temperature for 12 hours. After distilling away the solvent, the residue was purified by silica gel column chromatography with a solvent mixture of MDC/MeOH at a volume ratio of 8:2 as eluent to obtain 2.41 g of monomer precursor M16c.

Then 1.30 g (2 mmol) of the monomer precursor M16c was placed in a 100 mL round-bottom flask and 20 mL of super dehydrated MDC was added thereto to dissolve M16c. A total of 2.45 g (16 mmol) of trimethylsilyl bromide was added to the flask in a nitrogen atmosphere, followed by stirring for 24 hours. Extra trimethylsilyl bromide was purged of the obtained solution at room temperature under a reduced pressure to obtain 1.61 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.02 g of monomer M16.

The structure of the monomer precursor M16c and the monomer M16 obtained are illustrated below.

Monomer Precursor M16c

Monomer M16

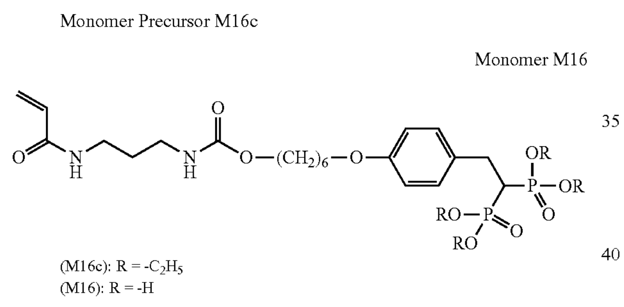

(M16c): R = $-C_2H_5$
(M16): R = -H

Synthesis Example 17 of Monomer

A total of 6.00 g (20 mmol) of ethylene-1,1-diylbis phosphonic acid tetraethyl ester (manufactured by Apollo Scientific Ltd.), 0.72 g (2 mmol) of trifluoromethane copper (II) sulphonate (manufactured by Sigma-Aldrich Corporation), and 5.46 g (30 mmol) of 6-hydroxy-2-naphthalene boronic acid (manufactured by TOKYO CHEMICAL INDUSTRY CO., LTD.) were placed in a 100 mL flask and 50 mL of dehydrated toluene (manufactured by Kanto Chemical Co., Inc.) was added thereto. The liquid mixture obtained was heated to 70 degrees 2θ C, stirred for 18 hours, and cooled down to room temperature, followed by diluting with 100 mL of dichloromethane (manufactured by Kanto Chemical Co., Inc.). The diluting liquid was extracted using a saturated aqueous solution of saturated ethylene diamine tetraacetic acid (manufactured by TOKYO CHEMICAL INDUSTRY CO., LTD.), followed by rinsing with water to isolate the organic phase. After distilling away the solvent, the residue was purified by silica gel column chromatography with a solvent mixture of acetone/hexane at a volume ratio of from 4:6 to 5:5 as eluent to obtain 6.54 g of monomer precursor M17a.

One hundred mL of methylethyl ketone was placed in a 200 mL flask. A total of 4.45 g (10 mmol) of the monomer precursor M17a, 2.72 g (15 mmol) of 6-bromo-1-hexanol (manufactured by TOKYO CHEMICAL INDUSTRY CO., LTD.), and 2.77 g (20 mmol) of potassium carbonate were added to the flask, then held at reflux for 12 hours. Subsequent to cooling down to room temperature, the substance obtained was filtered and the filtrate was condensed. The residue was purified by silica gel column chromatography with a solvent mixture of MDC/MeOH at a volume ratio of from 98:2 to 90:10 as eluent to obtain 3.87 g of monomer precursor M17b.

The structure of the monomer precursor M17a and the monomer precursor M17b obtained are illustrated below.

Monomer Precursor M17a
Monomer Precursor M17b

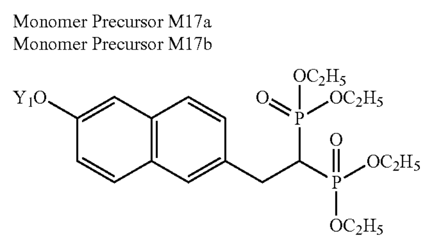

(M17a): $Y_1$ = -H
(M17b): $Y_1$ = $-(CH_2)_6OH$

A total of 20 mL of super dehydrated MDC was placed in a 100 mL flask and thereafter 2.72 g (5 mmol) of the monomer precursor M17b and 0.016 g (0.025 mmol) of dibutyltin dilaurate was added to the flask, followed by cooling with iced water in a nitrogen atmosphere. To the resulting substance, a solution in which 2.01 g (10 mmol) of 3-isoproppenyl-α,α-dimethyl benzyl isocyanate (manufactured by TOKYO CHEMICAL INDUSTRY CO., LTD.) was slowly added in 10 minutes, followed by stirring at 0 degrees C. to room temperature for 12 hours. After distilling away the solvent, the residue was purified by silica gel column chromatography with a solvent mixture of MDC/MeOH at a volume ratio of 8:2 as eluent to obtain 2.89 g of monomer precursor M17c.

Then 1.49 g (2 mmol) of the monomer precursor M17c was placed in a 100 mL round-bottom flask and 20 mL of super dehydrated MDC was added thereto to dissolve M17c. A total of 2.45 g (16 mmol) of trimethylsilyl bromide was added to the flask in a nitrogen atmosphere, followed by stirring for 24 hours. Extra trimethylsilyl bromide was purged of the obtained solution at room temperature under a reduced pressure to obtain 1.81 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.21 g of monomer M17.

The structure of the monomer precursor M17c and the monomer M17 obtained are illustrated below.

Monomer Precursor M17c

Monomer M17

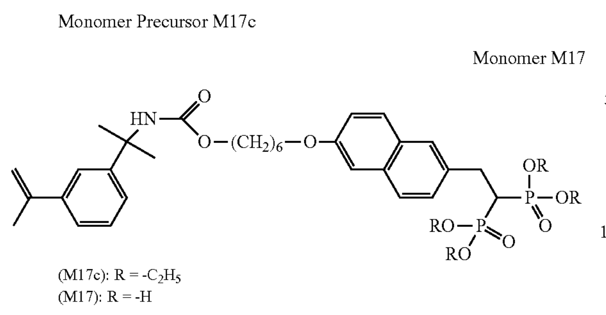

(M17c): R = $-C_2H_5$
(M17): R = -H

Synthesis Example 18 of Monomer

A total of 20 mL of super dehydrated MDC was placed in a 100 mL flask and thereafter 2.72 g (5 mmol) of the monomer precursor M17b and 0.016 g (0.025 mmol) of dibutyltin dilaurate was added to the flask, followed by cooling with iced water in a nitrogen atmosphere. To the resulting substance, 1.55 g (10 mmol) of 2-isocyanato ethyl methacrylate (manufactured by TOKYO CHEMICAL INDUSTRY CO., LTD.) was slowly added to the flask in five minutes, followed by stirring at 0 degrees C. to room temperature for 12 hours. After distilling away the solvent, the residue was purified by silica gel column chromatography with a solvent mixture of MDC/MeOH at a volume ratio of 8:2 as eluent to obtain 2.73 g of monomer precursor M18c.

Then 1.40 g (2 mmol) of the monomer precursor M18c was placed in a 100 mL round-bottom flask and 20 mL of super dehydrated MDC was added thereto to dissolve M18c. A total of 2.45 g (16 mmol) of trimethylsilyl bromide was added to the flask in a nitrogen atmosphere, followed by stirring for 24 hours. Extra trimethylsilyl bromide was purged of the obtained solution at room temperature under a reduced pressure to obtain 1.72 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.10 g of monomer M18.

The structure of the monomer precursor M18c and the monomer M18 obtained are illustrated below.

Monomer Precursor M18c

Monomer M18

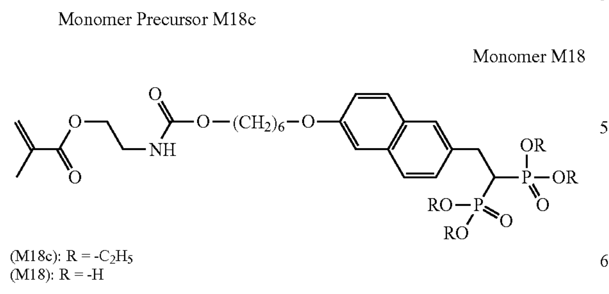

(M18c): R = $-C_2H_5$
(M18): R = -H

Synthesis Example 19 of Monomer

A total of 20 mL of super dehydrated MDC was placed in a 100 mL flask and thereafter 2.72 g (5 mmol) of the monomer precursor M17b and 0.016 g (0.025 mmol) of dibutyltin dilaurate was added to the flask, followed by cooling with iced water in a nitrogen atmosphere. To the resulting substance, 1.41 g (10 mmol) of 2-isocyanato ethyl acrylate (manufactured by TOKYO CHEMICAL INDUSTRY CO., LTD.) was slowly added to the flask in five minutes, followed by stirring at 0 degrees C. to room temperature for 12 hours. After distilling away the solvent, the residue was purified by silica gel column chromatography with a solvent mixture of MDC/MeOH at a volume ratio of 8:2 as eluent to obtain 2.58 g of monomer precursor M19c.

Then 1.37 g (2 mmol) of the monomer precursor M19c was placed in a 100 mL round-bottom flask and 20 mL of super dehydrated MDC was added thereto to dissolve M19c. A total of 2.45 g (16 mmol) of trimethylsilyl bromide was added to the flask in a nitrogen atmosphere, followed by stirring for 24 hours. Extra trimethylsilyl bromide was purged of the obtained solution at room temperature under a reduced pressure to obtain 1.68 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.09 g of monomer M19.

The structure of the monomer precursor M19c and the monomer M19 obtained are illustrated below.

Monomer Precursor M19c

Monomer M19

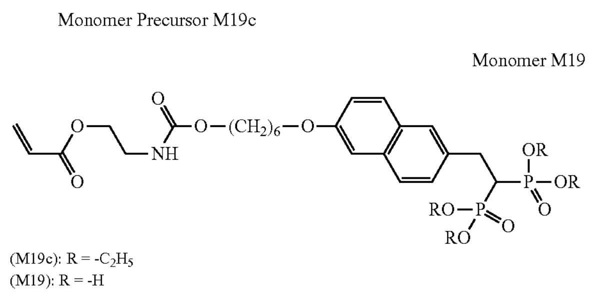

(M19c): R = $-C_2H_5$
(M19): R = -H

Synthesis Example 20 of Monomer

A total of 20 mL of super dehydrated MDC was placed in a 100 mL flask and thereafter 2.72 g (5 mmol) of the monomer precursor M17b and 0.016 g (0.025 mmol) of dibutyltin dilaurate was added to the flask, followed by cooling with iced water in a nitrogen atmosphere. To the resulting substance, 1.54 g (10 mmol) of N-(3-isocyanate propyl) acryl amide (manufactured by Chemieliva Pharmaceutical Co., Ltd.) was slowly added in five minutes, followed by stirring at 0 degrees C. to room temperature for 12 hours. After distilling away the solvent, the residue was purified by silica gel column chromatography with a solvent mixture of MDC/MeOH at a volume ratio of 8:2 as eluent to obtain 2.67 g of monomer precursor M20c.

Then 1.40 g (2 mmol) of the monomer precursor M20c was placed in a 100 mL round-bottom flask and 20 mL of super dehydrated MDC was added thereto to dissolve M20c. A total of 2.45 g (16 mmol) of trimethylsilyl bromide was added to the flask in a nitrogen atmosphere, followed by stirring for 24 hours. Extra trimethylsilyl bromide was purged of the obtained solution at room temperature under a reduced pressure to obtain 1.72 g of a white solid. A total of 40 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.13 g of monomer M20.

The structure of the monomer precursor M20c and the monomer M20 obtained are illustrated below.

Monomer Precursor M20c

Monomer M20

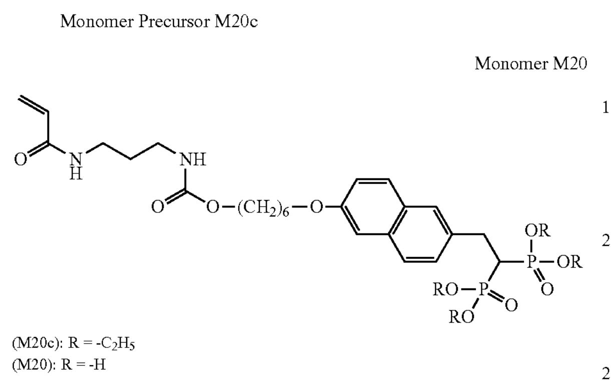

(M20c): R = $-C_2H_5$
(M20): R = -H

The structures of the monomers of M1 to M20 obtained in Synthesis Example of Monomer are shown in Tables 1 and 2 below.

TABLE 1

| Synthesis Example of monomer | Monomer | $R_1$ | $L_1$ | X |
|---|---|---|---|---|
| 1 | M1 | $—CH_3$ | — | —PhPrp- |
| 2 | M2 | $—CH_3$ | — | —PhPrp- |
| 3 | M3 | $—CH_3$ | — | —PhPrp- |
| 4 | M4 | $—CH_3$ | — | —PhPrp- |
| 5 | M5 | $—CH_3$ | —COO— | $—(CH_2)_2—$ |
| 6 | M6 | $—CH_3$ | —COO— | $—(CH_2)_2—$ |
| 7 | M7 | —H | —COO— | $—(CH_2)_2—$ |
| 8 | M8 | —H | —COO— | $—(CH_2)_2—$ |
| 9 | M9 | —H | —CONH— | $—(CH_2)_3—$ |
| 10 | M10 | —H | —CONH— | $—(CH_2)_3—$ |
| 11 | M11 | —H | —COO— | $—CH_2\ OCH_2—$ |
| 12 | M12 | —H | —COO— | $—CH_2\ OCH_2—$ |
| 13 | M13 | $—CH_3$ | — | —PhPrp- |
| 14 | M14 | $—CH_3$ | —COO— | $—(CH_2)_2—$ |
| 15 | M15 | —H | —COO— | $—(CH_2)_2—$ |
| 16 | M16 | —H | —CONH— | $—(CH_2)_3—$ |
| 17 | M17 | $—CH_3$ | — | —PhPrp- |
| 18 | M18 | $—CH_3$ | —COO— | $—(CH_2)_2—$ |
| 19 | M19 | —H | —COO— | $—(CH_2)_2—$ |
| 20 | M20 | —H | —CONH— | $—(CH_2)_3—$ |

TABLE 2

| Synthesis Example of monomer | Monomer | $L_2$ | Y | $L_3$ |
|---|---|---|---|---|
| 1 | M1 | —NH— | $—(CH_2)_2—$ | $—NH—C_2H_4—R_2$ |
| 2 | M2 | —NH— | $—(CH_2)_4—$ | $—NH—C_2H_4—R_2$ |
| 3 | M3 | —NH— | $—(CH_2)_8—$ | $—NH—C_2H_4—R_2$ |
| 4 | M4 | —NH— | $—(CH_2)_{12}—$ | $—NH—C_2H_4—R_2$ |
| 5 | M5 | —NH— | $—(CH_2)_6—$ | $—NH—C_2H_4—R_2$ |
| 6 | M6 | —O— | $—(CH_2)_6—$ | $—NH—C_2H_4—R_2$ |
| 7 | M7 | —NH— | $—(CH_2)_6—$ | $—NH—C_2H_4—R_2$ |
| 8 | M8 | —O— | $—(CH_2)_6—$ | $—NH—C_2H_4—R_2$ |
| 9 | M9 | —NH— | $—(CH_2)_6—$ | $—NH—C_2H_4—R_2$ |
| 10 | M10 | —O— | $—(CH_2)_6—$ | $—NH—C_2H_4—R_2$ |
| 11 | M11 | —NH— | $—(CH_2)_6—$ | $—NH—C_2H_4—R_2$ |
| 12 | M12 | —O— | $—(CH_2)_6—$ | $—NH—C_2H_4—R_2$ |
| 13 | M13 | —O— | $—(CH_2)_6—$ | $—O—Ph—CH_2CH—(R_2)_2$ |
| 14 | M14 | —O— | $—(CH_2)_6—$ | $—O—Ph—CH_2CH—(R_2)_2$ |
| 15 | M15 | —O— | $—(CH_2)_6—$ | $—O—Ph—CH_2CH—(R_2)_2$ |
| 16 | M16 | —O— | $—(CH_2)_6—$ | $—O—Ph—CH_2CH—(R_2)_2$ |
| 17 | M17 | —O— | $—(CH_2)_6—$ | $—O—Np—CH_2CH—(R_2)_2$ |
| 18 | M18 | —O— | $—(CH_2)_6—$ | $—O—Np—CH_2CH—(R_2)_2$ |
| 19 | M19 | —O— | $—(CH_2)_6—$ | $—O—Np—CH_2CH—(R_2)_2$ |
| 20 | M20 | —O— | $—(CH_2)_6—$ | $—O—Np—CH_2CH—(R_2)_2$ |

-PhPrp- in Table 1 means the following structure.

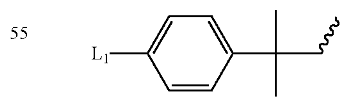

Comparative Synthesis Example 1 of Monomer

A total of 20 mL of super dehydrated MDC, 4.86 g (48 mmol) of triethylamine (manufactured by Kanto Chemical Co., Inc.), and 6.16 g (40 mmol) of 2-hydroxy ethyl phosphonic acid dimethyl ester (manufactured by TOKYO CHEMICAL INDUSTRY CO., LTD.) were added to a 100 ml three-necked flask. Thereafter, the liquid was stirred in a nitrogen atmosphere, followed by cooling the flask with iced water. To the resulting substance, 3.62 g (4 mmol) of chloride acrylate (manufactured by TOKYO CHEMICAL INDUSTRY CO., LTD.) was added to the flask in ten minutes, followed by stirring at 0 degrees C. to room temperature for 15 hours. The reaction solution obtained was diluted with 20 mL MDC. A saturated aqueous solution of sodium bicarbonate was added to the reaction solution, followed by shaking to isolate the separated organic phase, which was then rinsed with water. The organic phase was dried with magnesium sulfate (manufactured by Kanto Chemical Co., Inc.), followed by distilling the solvent away. The residue was purified by silica gel column chromatography with a solvent mixture of MDC/MeOH at a volume ratio of from 10:1 to 8:2 as eluent to obtain 5.88 g of monomer precursor RM1a.

Then 2.08 g (10 mmol) of the monomer precursor RM1a was placed in a 100 mL round-bottom flask and 10 mL of super dehydrated MDC was added thereto to dissolve RM1a. A solution in which 6.12 g (40 mmol) of trimethylsilyl bromide was dissolved in 15 mL of super-dehydrated MDC was added to the solution obtained in a nitrogen atmosphere, followed by stirring for 24 hours. Extra trimethylsilyl bromide was purged of the obtained solution at room temperature under a reduced pressure to obtain 3.07 g of oily matter. A total of 50 mL of MeOH was added in a nitrogen atmosphere followed by stirring for 24 hours. The volatile component was distilled away at room temperature under a reduced pressure. The residual obtained was rinsed with 30 mL of hexane twice, followed by drying at room temperature under a reduced pressure to obtain 1.62 g of comparative monomer RM1.

The structure of the comparative monomer RM1 obtained is illustrated below.

(RM1)

Comparative Monomer RM1

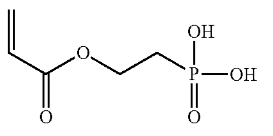

Comparative Synthesis Example 2 of Monomer

A total of 2.79 g (20 mmol) of 3-aminopropyl phosphonic acid (manufactured by Merck KGaA) was placed in a 100 mL three-necked flask. Forty mL of sodium hydroxide aqueous solution was added to the flask and dissolved during stirring. A total of 3.11 g (20 mmol) of 2-isocyanate ethyl methacrylate (manufactured by TOKYO CHEMICAL INDUSTRY CO., LTD.) was added dropwise to the flask in 15 minutes in a nitrogen atmosphere while the flask was being cooled with iced water, followed by stirring for three hours at 0 degrees C. to room temperature. After the precipitate was filtered and removed, 1 normal hydrochloric acid (manufactured by Kanto Chemical Co., Inc.) was added until pH of the filtrate reached 7. After stirring for 30 minutes, the precipitate was removed by filtering, followed by drying to obtain 2.8 g or comparative monomer RM2.

The structure of the comparative monomer RM2 obtained is illustrated below.

(RM2)

Comparative Monomer RM2

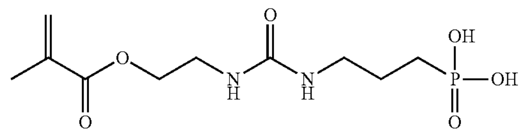

Synthesis of Polymer and Copolymer

Example 1

Twenty mL of 1,4-dioxane was placed in a 100 mL three-necked flask and dissolved in 3.70 g (10 mmol) of the monomer M1, followed by heating to 70 degrees C. in a nitrogen atmosphere. A solution in which 0.033 g (0.2 mmol) of 2,2'-azoiso(butylonitrile) (AIBN, manufactured by Tokyo Chemical Industry Co. Ltd.) and 0.011 g (0.1 mmol) of 3-mercapto propionic acid (3MPA, manufactured by Tokyo Chemical Industry Co. Ltd.) were dissolved in 5 mL of 1,4-dioxane was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 3.55 g of a polymer CP1 (number average molecular weight Mn of 9,400, weight average molecular weight Mw of 22,000).

Example 2

A total of 3.96 g (10 mmol) of the monomer M1 and 0.58 g (5 mmol) of 2-hydroxyethyl acrylate (manufactured by Tokyo Chemical Industry Co. Ltd.) were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 5.05 g of a polymer CP2 (number average molecular weight Mn of 9,600, weight average molecular weight Mw of 23,400).

Example 3

A total of 3.96 g (10 mmol) of the monomer M1 and 0.36 g (5 mmol) of acrylic acid (manufactured by Tokyo Chemical Industry Co. Ltd.) were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.72 g of a polymer CP3 (number average molecular weight Mn of 9,900, weight average molecular weight Mw of 23,900).

Example 4

A total of 3.98 g (10 mmol) of the monomer M2 was dissolved in 20 mL of 1,4-dioxane in a 100 mL three-necked flask, followed by heating to 70 degrees C. in a nitrogen atmosphere. A solution in which 0.033 g (0.2 mmol) of AIBN and 0.011 g (0.1 mmol) of 3 MPA were dissolved in 5 mL of 1,4-dioxane was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 3.77 g of a polymer CP4 (number average molecular weight Mn of 10,100, weight average molecular weight Mw of 22,000).

Example 5

A total of 3.98 g (10 mmol) of the monomer M2 and 0.65 g (5 mmol) of 2-methoxyethyl acrylate (MTA, manufactured by Tokyo Chemical Industry Co. Ltd.) were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 5.05 g of polymer CP5 (number average molecular weight Mn of 10,100, weight average molecular weight Mw of 24,900).

Example 6

A total of 3.98 g (10 mmol) of the monomer M2 and 0.36 g (5 mmol) of acrylic acid were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.20 g of copolymer CP6 (number average molecular weight Mn of 10,300, weight average molecular weight Mw of 24,800).

Example 7

A total of 4.54 g (10 mmol) of the monomer M3 and 0.72 g (5 mmol) of 2-ethoxyethyl acrylate (EEA, manufactured by Tokyo Chemical Industry Co. Ltd.) were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 5.05 g of a polymer CP7 (number average molecular weight Mn of 10,700, weight average molecular weight Mw of 25,800).

Example 8

A total of 4.54 g (10 mmol) of the monomer M3 and 0.36 g (5 mmol) of acrylic acid were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.20 g of copolymer CP8 (number average molecular weight Mn of 10,900, weight average molecular weight Mw of 25,900).

Example 9

A total of 4.54 g (10 mmol) of the monomer M4 and 0.58 g (5 mmol) of 2-hydroxyethyl acrylate (HEA) were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 5.05 g of a polymer CP9 (number average molecular weight Mn of 10,700, weight average molecular weight Mw of 25,800).

Example 10

A total of 4.54 g (10 mmol) of the monomer M4 and 0.36 g (5 mmol) of acrylic acid were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.20 g of copolymer CP10 (number average molecular weight Mn of 10,900, weight average molecular weight Mw of 25,900).

Example 11

A total of 3.79 g (10 mmol) of the monomer M5 and 0.58 g (5 mmol) of 2-hydroxyethyl acrylate were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.33 g of a polymer CP11 (number average molecular weight Mn of 10,100, weight average molecular weight Mw of 24,900).

Example 12

A total of 3.79 g (10 mmol) of the monomer M5 and 0.43 g (5 mmol) of methacrylic acid were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 3.98 g of copolymer CP12 (number average molecular weight Mn of 10,600, weight average molecular weight Mw of 25,000).

Example 13

A total of 3.80 g (10 mmol) of the monomer M6 and 0.58 g (5 mmol) of 2-hydroxyethyl acrylate were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.13 g of a polymer CP13 (number average molecular weight Mn of 10,000, weight average molecular weight Mw of 24,100).

Example 14

A total of 3.80 g (10 mmol) of the monomer M6 and 0.43 g (5 mmol) of methacrylic acid were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.06 g of copolymer CP14 (number average molecular weight Mn of 10,300, weight average molecular weight Mw of 24,300).

Example 15

A total of 3.65 g (10 mmol) of the monomer M7 and 0.43 g (5 mmol) of methacrylic acid were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 3.84 g of copolymer CP15 (number average molecular weight Mn of 10,000, weight average molecular weight Mw of 23,800).

Example 16

A total of 3.66 g (10 mmol) of the monomer M8 and 0.43 g (5 mmol) of methacrylic acid were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 3.76 g of copolymer CP16 (number average molecular weight Mn of 10,500, weight average molecular weight Mw of 23,900).

Example 17

A total of 3.78 g (10 mmol) of the monomer M9 and 0.43 g (5 mmol) of methacrylic acid were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 3.76 g of copolymer CP17 (number average molecular weight Mn of 11,000, weight average molecular weight Mw of 24,300).

Example 18

A total of 3.79 g (10 mmol) of the monomer M10 and 0.43 g (5 mmol) of methacrylic acid were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 3.99 g of copolymer CP18 (number average molecular weight Mn of 11,300, weight average molecular weight Mw of 25,100).

Example 19

A total of 4.09 g (10 mmol) of the monomer M11 and 0.43 g (5 mmol) of methacrylic acid were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.50 g of copolymer CP19 (number average molecular weight Mn of 11,600, weight average molecular weight Mw of 25,600).

Example 20

A total of 4.10 g (10 mmol) of the monomer M12 and 0.43 g (5 mmol) of methacrylic acid were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.44 g of copolymer CP20 (number average molecular weight Mn of 11,000, weight average molecular weight Mw of 25,100).

Example 21

A total of 5.84 g (10 mmol) of the monomer M13 and 2.32 g (20 mmol) of 2-hydroxyethyl acrylate were dissolved in 40 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.099 g (0.6 mmol) of AIBN and 0.032 g (0.3 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 7.18 g of a polymer CP21 (number average molecular weight Mn of 10,200, weight average molecular weight Mw of 23,200).

Example 22

A total of 5.84 g (10 mmol) of the monomer M13 and 1.72 g (20 mmol) of methacrylic acid were dissolved in 40 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.099 g (0.6 mmol) of AIBN and 0.032 g (0.3 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 6.72 g of copolymer CP22 (number average molecular weight Mn of 10,900, weight average molecular weight Mw of 25,400).

Example 23

A total of 5.38 g (10 mmol) of the monomer M14 and 1.72 g (20 mmol) of methacrylic acid were dissolved in 40 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.099 g (0.6 mmol) of AIBN and 0.032 g (0.3 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 6.39 g of a polymer CP23 (number average molecular weight Mn of 10,200, weight average molecular weight Mw of 23,800).

Example 24

A total of 5.23 g (10 mmol) of the monomer M15 and 1.72 g (20 mmol) of methacrylic acid were dissolved in 40 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.099 g (0.6 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 6.32 g of a polymer CP24 (number average molecular weight Mn of 13,000, weight average molecular weight Mw of 30,000).

Example 25

A total of 5.37 g (10 mmol) of the monomer M16 and 1.72 g (20 mmol) of methacrylic acid were dissolved in 40 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.099 g (0.6 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 6.52 g of copolymer CP25 (number average molecular weight Mn of 13,200, weight average molecular weight Mw of 29,700).

Example 26

A total of 6.34 g (10 mmol) of the monomer M17 and 2.32 g (20 mmol) of 2-hydroxyethyl acrylate were dissolved in 40 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.099 g (0.6 mmol) of AIBN and 0.032 g (0.3 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 7.70 g of a polymer CP26 (number average molecular weight Mn of 11,100, weight average molecular weight Mw of 24,400).

Example 27

A total of 6.34 g (10 mmol) of the monomer M17 and 1.72 g (20 mmol) of methacrylic acid were dissolved in 40 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.099 g (0.6 mmol) of AIBN and 0.032 g (0.3 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 7.42 g of copolymer CP27 (number average molecular weight Mn of 10,500, weight average molecular weight Mw of 24,600).

Example 28

A total of 5.88 g (10 mmol) of the monomer M18 and 1.72 g (20 mmol) of methacrylic acid were dissolved in 40 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.099 g (0.6 mmol) of AIBN and 0.032 g (0.3 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 6.53 g of copolymer CP28 (number average molecular weight Mn of 10,900, weight average molecular weight Mw of 23,900).

Example 29

A total of 5.74 g (10 mmol) of the monomer M19 and 1.72 g (20 mmol) of methacrylic acid were dissolved in 40 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.099 g (0.6 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 6.71 g of copolymer CP29 (number average molecular weight Mn of 13,900, weight average molecular weight Mw of 30,300).

Example 30

A total of 5.87 g (10 mmol) of the monomer M20 and 1.72 g (20 mmol) of methacrylic acid were dissolved in 40 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.099 g (0.6 mmol) of AIBN and 0.016 g (0.15 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 7.06 g of copolymer CP30 (number average molecular weight Mn of 13,500, weight average molecular weight Mw of 29,300).

Example 67

A total of 3.96 g (10 mmol) of the monomer M1 and 0.58 g (5 mmol) of 2-hydroxyethyl acrylate (manufactured by Tokyo Chemical Industry Co. Ltd.) were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.123 g (0.75 mmol) of AIBN and 0.159 g (1.50 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.40 g of a polymer CP31 (number average molecular weight Mn of 1,900, weight average molecular weight Mw of 4,000).

Example 68

A total of 3.98 g (10 mmol) of the monomer M2 and 0.65 g (5 mmol) of 2-methoxyethyl acrylate (MTA, manufactured by Tokyo Chemical Industry Co. Ltd.) were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.123 g (0.75 mmol) of AIBN and 0.159 g (1.50 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.44 g of a polymer CP32 (number average molecular weight Mn of 2,000, weight average molecular weight Mw of 4,500).

Example 69

A total of 3.80 g (10 mmol) of the monomer M6 and 0.58 g (5 mmol) of 2-hydroxyethyl acrylate were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.002 g (0.018 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.24 g of a polymer CP33 (number average molecular weight Mn of 19,000, weight average molecular weight Mw of 52,000).

Example 70

A total of 4.10 g (10 mmol) of the monomer M12 and 0.43 g (5 mmol) of methacrylic acid were dissolved in 12 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.049 g (0.3 mmol) of AIBN and 0.002 g (0.018 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.38 g of copolymer CP34 (number average molecular weight Mn of 20,000, weight average molecular weight Mw of 55,000).

Comparative Example 1

A total of 3.60 g (10 mmol) of the comparative monomer RM1 was dissolved in 15 mL of 1,4-dioxane in a 100 mL three-necked flask, followed by heating to 70 degrees C. in a nitrogen atmosphere. A solution in which 0.066 g (0.4 mmol) of AIBN and 0.021 g (0.2 mmol) of 3 MPA were dissolved in 5 mL of 1,4-dioxane was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 3.41 g of comparative polymer RCP1 (number average molecular weight Mn of 9,100, weight average molecular weight Mw of 21,800).

Comparative Example 2

A total of 3.60 g (20 mmol) of the comparative monomer RM1 and 1.16 g (10 mmol) of 2-hydroxyethyl acrylate were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.099 g (0.6 mmol) of AIBN and 0.032 g (0.3 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.50 g of comparative polymer RCP2 (number average molecular weight Mn of 9,200, weight average molecular weight Mw of 22,200).

Comparative Example 3

A total of 3.60 g (20 mmol) of the comparative monomer RM1 and 0.72 g (10 mmol) of acrylic acid (manufactured by Tokyo Chemical Industry Co. Ltd.) were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.099 g (0.6 mmol) of AIBN and 0.032 g (0.3 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.07 g of comparative copolymer RCP3 (number average molecular weight Mn of 9,500, weight average molecular weight Mw of 22,800).

Comparative Example 4

A total of 3.99 g (15 mmol) of the comparative monomer RM2 was dissolved in 15 mL of 1,4-dioxane in a 100 mL three-necked flask, followed by heating to 70 degrees C. in a nitrogen atmosphere. A solution in which 0.049 g (0.3 mmol) of AIBN and 0.016 g (0.15 mmol) of 3 MPA were dissolved in 5 mL of 1,4-dioxane was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 3.74 g of comparative polymer RCP4 (number average molecular weight Mn of 9,800, weight average molecular weight Mw of 22,700).

Comparative Example 5

A total of 3.99 g (15 mmol) of the comparative monomer RM2 and 0.87 g (7.5 mmol) of 2-hydroxyethyl acrylate (HEA) were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.074 g (0.45 mmol) of AIBN and 0.023 g (0.23 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.63 g of comparative polymer RCP5 (number average molecular weight Mn of 10,400, weight average molecular weight Mw of 23,500).

Comparative Example 6

A total of 3.99 g (15 mmol) of the comparative monomer RM2 and 0.72 g (7.5 mmol) of acrylic acid (manufactured by Tokyo Chemical Industry Co. Ltd.) were dissolved in 25 mL of 1,4-dioxane to prepare a monomer solution. A total of 10 percent by mass of the prepared monomer solution was placed in a 100 mL three-necked flask and heated to 70 degrees C. in a nitrogen atmosphere. Thereafter, a solution in which 0.074 g (0.45 mmol) of AIBN and 0.024 g (0.23 mmol) of 3MPA were dissolved in the rest of the monomer solution was added dropwise to the flask in one hour, followed by stirring at 70 degrees C. for six hours. The resulting solution was cooled down to room temperature (25 degrees C.) and the thus-obtained reaction solution was added dropwise to hexane. The precipitate was removed by filtering, followed by drying under a reduced pressure to obtain 4.44 g of comparative copolymer RCP6 (number average molecular weight Mn of 10,600, weight average molecular weight Mw of 24,000).

The structure, the number average molecular weight Mn, and the weight average molecular weight Mw of the polymer and the copolymer synthesized in Synthesis Examples above are shown in Table 3.

TABLE 3

| | | Monomer | | | |
|---|---|---|---|---|---|
| | | First | Second monomer | | Third |
| Example | (Co)polymer | monomer | $R_2$ | $X^+$ | monomer |
| Example 1 | CP1 | M1 | — | — | — |
| Example 2 | CP2 | M1 | — | — | HEA |
| Example 3 | CP3 | M1 | H | $H^+$ | — |
| Example 4 | CP4 | M2 | — | — | — |
| Example 5 | CP5 | M2 | — | — | MTA |
| Example 6 | CP6 | M2 | H | $H^+$ | — |
| Example 7 | CP7 | M3 | — | — | EEA |
| Example 8 | CP8 | M3 | H | $H^+$ | — |
| Example 9 | CP9 | M4 | — | — | HEA |
| Example 10 | CP10 | M4 | H | $H^+$ | — |
| Example 11 | CP11 | M5 | — | — | HEA |
| Example 12 | CP12 | M5 | $CH_3$ | $H^+$ | — |
| Example 13 | CP13 | M6 | — | — | HEA |
| Example 14 | CP14 | M6 | $CH_3$ | $H^+$ | — |
| Example 15 | CP15 | M7 | $CH_3$ | $H^+$ | — |
| Example 16 | CP16 | M8 | $CH_3$ | $H^+$ | — |
| Example 17 | CP17 | M9 | $CH_3$ | $H^+$ | — |
| Example 18 | CP18 | M10 | $CH_3$ | $H^+$ | — |
| Example 19 | CP19 | M11 | $CH_3$ | $H^+$ | — |
| Example 20 | CP20 | M12 | $CH_3$ | $H^+$ | — |
| Example 21 | CP21 | M13 | — | — | HEA |
| Example 22 | CP22 | M13 | $CH_3$ | $H^+$ | — |
| Example 23 | CP23 | M14 | $CH_3$ | $H^+$ | — |
| Example 24 | CP24 | M15 | $CH_3$ | $H^+$ | — |
| Example 25 | CP25 | M16 | $CH_3$ | $H^+$ | — |
| Example 26 | CP26 | M17 | — | — | HEA |
| Example 27 | CP27 | M17 | $CH_3$ | $H^+$ | — |
| Example 28 | CP28 | M18 | $CH_3$ | $H^+$ | — |
| Example 29 | CP29 | M19 | $CH_3$ | $H^+$ | — |
| Example 30 | CP30 | M20 | $CH_3$ | $H^+$ | — |
| Example 67 | CP31 | M1 | — | — | HEA |
| Example 68 | CP32 | M2 | — | — | MTA |
| Example 69 | CP33 | M6 | — | — | HEA |
| Example 70 | CP34 | M12 | $CH_3$ | $H^+$ | — |
| Comparative Example 1 | RCP1 | RM1 | — | — | — |
| Comparative Example 2 | RCP2 | RM1 | — | — | HEA |
| Comparative Example 3 | RCP3 | RM1 | H | $H^+$ | — |
| Comparative Example 4 | RCP4 | RM2 | — | — | — |
| Comparative Example 5 | RCP5 | RM2 | — | — | HEA |
| Comparative Example 6 | RCP6 | RM2 | H | $H^+$ | — |

| Example | (Co)polymer | Number average molecular weight Mn | Weight average molecular weight Mw |
|---|---|---|---|
| Example 1 | CP1 | 9,400 | 22,000 |
| Example 2 | CP2 | 9,600 | 23,400 |
| Example 3 | CP3 | 9,900 | 23,900 |
| Example 4 | CP4 | 10,100 | 22,000 |
| Example 5 | CP5 | 10,100 | 24,900 |
| Example 6 | CP6 | 10,300 | 24,800 |
| Example 7 | CP7 | 10,700 | 25,800 |
| Example 8 | CP8 | 10,900 | 25,900 |
| Example 9 | CP9 | 10,700 | 25,800 |
| Example 10 | CP10 | 10,900 | 25,900 |
| Example 11 | CP11 | 10,100 | 24,900 |

TABLE 3-continued

| | | | |
|---|---|---|---|
| Example 12 | CP12 | 10,600 | 25,000 |
| Example 13 | CP13 | 10,000 | 24,100 |
| Example 14 | CP14 | 10,300 | 24,300 |
| Example 15 | CP15 | 10,000 | 23,800 |
| Example 16 | CP16 | 10,500 | 23,900 |
| Example 17 | CP17 | 11,000 | 24,300 |
| Example 18 | CP18 | 11,300 | 25,100 |
| Example 19 | CP19 | 11,600 | 25,600 |
| Example 20 | CP20 | 11,000 | 25,100 |
| Example 21 | CP21 | 10,200 | 23,200 |
| Example 22 | CP22 | 10,900 | 25,400 |
| Example 23 | CP23 | 10,200 | 23,800 |
| Example 24 | CP24 | 13,000 | 30,000 |
| Example 25 | CP25 | 13,200 | 29,700 |
| Example 26 | CP26 | 11,100 | 24,400 |
| Example 27 | CP27 | 10,500 | 24,600 |
| Example 28 | CP28 | 10,900 | 23,900 |
| Example 29 | CP29 | 13,900 | 30,300 |
| Example 30 | CP30 | 13,500 | 29,300 |
| Example 67 | CP31 | 1,900 | 4,000 |
| Example 68 | CP32 | 2,000 | 4,500 |
| Example 69 | CP33 | 19,000 | 52,000 |
| Example 70 | CP34 | 20,000 | 55,000 |
| Comparative Example 1 | RCP1 | 9,100 | 21,800 |
| Comparative Example 2 | RCP2 | 9,200 | 22,200 |
| Comparative Example 3 | RCP3 | 9,500 | 22,800 |
| Comparative Example 4 | RCP4 | 9,800 | 22,700 |
| Comparative Example 5 | RCP5 | 10,400 | 23,500 |
| Comparative Example 6 | RCP6 | 10,600 | 24,000 |

In Table 3, HEA represents 2-hydroxy ethylacrylate, MTA represents 2-methoxy ethylacrylate, and EEA represents 2-ethoxy ethyl acrylate.

Preparation of Aqueous Ink 1

Example 31

Preparation of Pigment Dispersion PD1

A total of 35.0 parts of deionized water and 5.0 parts of ethylene glycol (manufactured by TOKYO CHEMICAL INDUSTRY CO., LTD.) was placed in a glass vessel, followed by stirring. A total of 15 parts of the polymer CP1 prepared in Example 1 was added and dissolved. Next, 40.0 parts of titanium oxide JR-600A (manufactured by TAYCA CORPORATION) was slowly added during stirring, followed by stirring for 12 hours. A total of 540.0 parts of 1 mm zirconia beads was added to the vessel, followed by dispersion with Big Rotor BR-2, manufactured by AS ONE Corporation, at a rate of rotation of 90 rotation per minute (rpm) for 5 days. Next, the resulting matter was filtered through a membrane filter having an average pore size of 5.0 m and a balance of deionized water was added to obtain 90.0 parts of pigment dispersion PD1 (pigment solid concentration of 40 percent by mass).

Preparation of Ink

A total of 20.0 parts of the pigment dispersion PD1, 18.0 parts of ethylene glycol, 4.0 parts of 3-methoxy-N,N-dimethyl propionamide (manufactured by TOKYO CHEMICAL INDUSTRY CO., LTD.), 1.0 part of Zonyl FS-300 (fluorochemical surfactant, solid content of 40 percent, manufactured by E. I. du Pont de Nemours and Company), 0.2 parts of triethanol amine (manufactured by TOKYO CHEMICAL INDUSTRY CO., LTD.), 1.0 part of 1,2-benzothiazoline-3-one (manufactured by TOKYO CHEMICAL INDUSTRY CO., LTD.), and 57.0 parts of deionized water were mixed and stirred for one hour, followed by filtering with a 1.2 μm membrane filter to obtain the ink 1 of the present disclosure.

Preparation of Aqueous Ink 2

Example 32

The pigment Dispersant PD2 and the ink 2 were obtained in the same manner as in Example 31 except that the polymer CP2 prepared in Example 2 was used instead of the polymer CP1.

Preparation of Aqueous Ink 3

Example 33

Preparation of Pigment Dispersion PD3

A total of 35.0 parts of deionized water and 5.0 parts of glycerol (manufactured by TOKYO CHEMICAL INDUSTRY CO., LTD.) were placed in a glass vessel, followed by stirring. A total of 15 parts of the polymer CP3 prepared in Example 3 and 2.9 parts of (2 -hydroxyethyl)dimethyl amine were added and dissolved. Next, 40.0 parts of titanium oxide JR-600A (manufactured by TAYCA CORPORATION) was slowly added during stirring, followed by stirring for 12 hours. A total of 540.0 parts of 1 mm zirconia beads was added to the vessel, followed by dispersion with Big Rotor BR-2, manufactured by AS ONE Corporation, at a rate of rotation of 90 rotation per minute (rpm) for 5 days. Next, the resulting matter was filtered through a membrane filter having an average pore size of 5 m and a balance of deionized water was added to obtain 90.0 parts of pigment dispersion PD3 (pigment solid concentration of 40 percent by mass).

Preparation of Ink

The Ink 3 was obtained in the same manner as in Example 31 except that the pigment dispersion PD3 was used instead of the pigment dispersion PD1.

Preparation of Aqueous Ink 4

Example 34

The pigment dispersion PD4 and the ink 4 were obtained in the same manner as in Example 31 except that the polymer CP4 prepared in Example 4 was used instead of the polymer CP1.

Preparation of Aqueous Ink 5

Examples 35

The pigment dispersion PD5 and the ink 5 were obtained in the same manner as in Example 31 except that the polymer CP5 prepared in Example 5 was used instead of the polymer CP1.

Preparation of Aqueous Ink 6

Example 36

The pigment dispersion PD6 and the ink 6 were obtained in the same manner as in the same manner as in Example 33 except that the copolymer CP6 prepared in Example 6 was used instead of the copolymer CP3 prepared in Example 33 and 2.9 parts of (2-hydroxyethyl)dimethyl amine prepared in Example 33 was replaced with 2.3 parts of (2-hydroxyethyl) dimethyl amine.

Preparation of Aqueous Ink 7

Example 37

The pigment dispersion PD7 and the ink 7 were obtained in the same manner as in Example 31 except that the polymer CP7 prepared in Example 7 was used instead of the polymer CP1.

Preparation of Aqueous Ink 8

Example 38

The pigment dispersion PD8 and the ink 8 were obtained in the same manner as in the same manner as in Example 33 except that the copolymer CP8 prepared in Example 8 was used instead of the copolymer CP3 prepared in Example 33 and 2.9 parts of (2-hydroxyethyl)dimethyl amine prepared in Example 33 was replaced with 2.0 parts of (2-hydroxyethyl) dimethyl amine.

Preparation of Aqueous Ink 9

Example 39

The pigment dispersion PD9 and the ink 9 were obtained in the same manner as in Example 31 except that the polymer CP9 prepared in Example 9 was used instead of the polymer CP1.

Preparation of Aqueous Ink 10

Example 40

The pigment dispersion PD10 and the ink 10 were obtained in the same manner as in the same manner as in Example 33 except that the copolymer CP10 prepared in Example 10 was used instead of the copolymer CP3 prepared in Example 33 and 2.9 parts of (2-hydroxyethyl) dimethyl amine prepared in Example 33 was replaced with 1.8 parts of (2-hydroxyethyl)dimethyl amine.

Preparation of Aqueous Ink 11

Example 41

The pigment dispersion PD11 and the ink 11 were obtained in the same manner as in Example 31 except that the polymer CP11 prepared in Example 11 was used instead of the polymer CP1.

Preparation of Aqueous Ink 12

Example 42

The pigment dispersion PD12 and the ink 12 were obtained in the same manner as in the same manner as in Example 33 except that the copolymer CP12 prepared in Example 12 was used instead of the copolymer CP3 prepared in Example 33 and 2.9 parts of (2-hydroxyethyl) dimethyl amine prepared in Example 33 was replaced with 2.3 parts of (2-hydroxyethyl)dimethyl amine.

Preparation of Aqueous Ink 13

Example 43

The pigment dispersion PD13 and the ink 13 were obtained in the same manner as in Example 31 except that the polymer CP13 prepared in Example 13 was used instead of the polymer CP1.

Preparation of Aqueous Ink 14

Example 44

The pigment dispersion PD14 and the ink 14 were obtained in the same manner as in the same manner as in Example 33 except that the copolymer CP14 prepared in Example 14 was used instead of the copolymer CP3 prepared in Example 33 and 2.9 parts of (2-hydroxyethyl) dimethyl amine prepared in Example 33 was replaced with 2.3 parts of (2-hydroxyethyl)dimethyl amine.

Preparation of Aqueous Ink 15

Example 45

The pigment dispersion PD15 and the ink 15 were obtained in the same manner as in the same manner as in Example 33 except that the copolymer CP15 prepared in Example 15 was used instead of the copolymer CP3 prepared in Example 33 and 2.9 parts of (2-hydroxyethyl) dimethyl amine prepared in Example 33 was replaced with 2.4 parts of (2-hydroxyethyl)dimethyl amine.

Preparation of Aqueous Ink 16

Example 46

The pigment dispersion PD16 and the ink 16 were obtained in the same manner as in the same manner as in Example 33 except that the copolymer CP16 prepared in Example 16 was used instead of the copolymer CP3 prepared in Example 33 and 2.9 parts of (2-hydroxyethyl) dimethyl amine prepared in Example 33 was replaced with 2.4 parts of (2-hydroxyethyl)dimethyl amine.

Preparation of Aqueous Ink 17

Example 47

The pigment dispersion PD17 and the ink 17 were obtained in the same manner as in the same manner as in Example 33 except that the copolymer CP17 prepared in Example 17 was used instead of the copolymer CP3 prepared in Example 33 and 2.9 parts of (2-hydroxyethyl) dimethyl amine prepared in Example 33 was replaced with 2.3 parts of (2-hydroxyethyl)dimethyl amine.

Preparation of Aqueous Ink 18

Example 48

The pigment dispersion PD18 and the ink 18 were obtained in the same manner as in the same manner as in Example 33 except that the copolymer CP18 prepared in Example 18 was used instead of the copolymer CP3 prepared in Example 33 and 2.9 parts of (2 -hydroxyethyl) dimethyl amine prepared in Example 33 was replaced with 2.3 parts of (2-hydroxyethyl)dimethyl amine.

Preparation of Aqueous Ink 19

Example 49

The pigment dispersion PD19 and the ink 19 were obtained in the same manner as in the same manner as in Example 33 except that the copolymer CP19 prepared in Example 19 was used instead of the copolymer CP3 prepared in Example 33 and 2.9 parts of (2-hydroxyethyl) dimethyl amine prepared in Example 33 was replaced with 2.2 parts of (2-hydroxyethyl)dimethyl amine.

Preparation of Aqueous Ink 20

Example 50

The pigment dispersion PD20 and the ink 20 were obtained in the same manner as in the same manner as in Example 33 except that the copolymer CP20 prepared in Example 20 was used instead of the copolymer CP3 prepared in Example 33 and 2.9 parts of (2-hydroxyethyl) dimethyl amine prepared in Example 33 was replaced with 1.8 parts of sodium hydroxide (manufactured by Kanto Chemical Co., Inc.).

Preparation of Aqueous Ink 21

Example 51

The pigment dispersion PD21 and the ink 21 were obtained in the same manner as in Example 31 except that the polymer CP21 prepared in Example 21 was used instead of the polymer CP1.

Preparation of Aqueous Ink 22

Example 52

The pigment dispersion PD22 and the ink 22 were obtained in the same manner as in the same manner as in Example 33 except that the copolymer CP22 prepared in Example 22 was used instead of the copolymer CP3 prepared in Example 33 and 2.9 parts of (2-hydroxyethyl) dimethyl amine prepared in Example 33 was replaced with 1.6 parts of (2-hydroxyethyl)dimethyl amine.

Preparation of Aqueous Ink 23

Example 53

The pigment dispersion PD23 and the ink 23 were obtained in the same manner as in the same manner as in Example 33 except that the copolymer CP23 prepared in Example 23 was used instead of the copolymer CP3 prepared in Example 33 and 2.9 parts of (2-hydroxyethyl) dimethyl amine prepared in Example 33 was replaced with 1.7 parts of (2 -hydroxyethyl)dimethyl amine.

Preparation of Aqueous Ink 24

Example 54

The pigment dispersion PD24 and the ink 24 were obtained in the same manner as in the same manner as in Example 33 except that the copolymer CP24 prepared in Example 24 was used instead of the copolymer CP3 prepared in Example 33 and 2.9 parts of (2-hydroxyethyl) dimethyl amine prepared in Example 33 was replaced with 1.8 parts of (2-hydroxyethyl)dimethyl amine.

Preparation of Aqueous Ink 25

Example 55

The pigment dispersion PD25 and the ink 25 were obtained in the same manner as in the same manner as in Example 33 except that the copolymer CP25 prepared in Example 25 was used instead of the copolymer CP3 prepared in Example 33 and 2.9 parts of (2-hydroxyethyl) dimethyl amine prepared in Example 33 was replaced with 1.7 parts of (2-hydroxyethyl)dimethyl amine.

Preparation of Aqueous Ink 26

Example 56

The pigment dispersion PD26 and the ink 26 were obtained in the same manner as in Example 31 except that the polymer CP26 prepared in Example 26 was used instead of the polymer CP1.

Preparation of Aqueous Ink 27

Example 57

The pigment dispersion PD27 and the ink 27 were obtained in the same manner as in the same manner as in Example 33 except that the copolymer CP27 prepared in Example 27 was used instead of the copolymer CP3 prepared in Example 33 and 2.9 parts of (2-hydroxyethyl) dimethyl amine prepared in Example 33 was replaced with 1.5 parts of (2-hydroxyethyl)dimethyl amine.

Preparation of Aqueous Ink 28

Example 58

The pigment dispersion PD28 and the ink 28 were obtained in the same manner as in the same manner as in Example 33 except that the copolymer CP28 prepared in Example 28 was used instead of the copolymer CP3 prepared in Example 33 and 2.9 parts of (2-hydroxyethyl) dimethyl amine prepared in Example 33 was replaced with 1.6 parts of (2-hydroxyethyl)dimethyl amine.

Preparation of Aqueous Ink 29

Example 59

The pigment dispersion PD29 and the ink 29 were obtained in the same manner as in the same manner as in Example 33 except that the copolymer CP29 prepared in Example 29 was used instead of the copolymer CP3 prepared in Example 33 and 2.9 parts of (2-hydroxyethyl) dimethyl amine prepared in Example 33 was replaced with 1.6 parts of (2-hydroxyethyl)dimethyl amine.

Preparation of Aqueous Ink 30

Example 60

The pigment dispersion PD30 and the ink 30 were obtained in the same manner as in the same manner as in Example 33 except that the copolymer CP30 prepared in Example 30 was used instead of the copolymer CP3 prepared in Example 33 and 2.9 parts of (2-hydroxyethyl) dimethyl amine prepared in Example 33 was replaced with 1.6 parts of (2-hydroxyethyl)dimethyl amine.

Preparation of Aqueous Ink 31

Example 61

Preparation of Ink

A total of 25.0 parts of the pigment dispersion PD1, 18.0 parts of ethylene glycol, 4.0 parts of 3-methoxy-N,N-dimethyl propionamide (manufactured by TOKYO CHEMICAL INDUSTRY CO., LTD.), 1.0 part of Zonyl FS-300 (fluorochemical surfactant, solid content of 40 percent, manufactured by E. I. du Pont de Nemours and Company), 0.2 parts of triethanol amine (manufactured by TOKYO CHEMICAL INDUSTRY CO., LTD.), 1.0 part of 1,2-benzothiazoline-3-one (manufactured by TOKYO CHEMICAL INDUSTRY CO., LTD.), and 50.8 parts of deionized water were mixed and stirred for one hour, followed by filtering with a 1.2 μm membrane filter to obtain the ink 31 of the present disclosure.

Preparation of Aqueous Ink 32

Example 62

Preparation of Pigment Dispersion PD31

A total of 35.0 parts of deionized water and 5.0 parts of ethylene glycol (manufactured by TOKYO CHEMICAL INDUSTRY CO., LTD.) was placed in a glass vessel, followed by stirring. A total of 15 parts of the polymer CP1 prepared in Example 1 was added and dissolved. Next, 8.06 parts of titanium oxide pigment JR-600A (manufactured by TAYCA CORPORATION) was slowly added during stirring, followed by stirring for 12 hours. A total of 540.0 parts of 1 mm zirconia beads was added to the vessel, followed by dispersion with Big Rotor BR-2, manufactured by AS ONE Corporation, at a rate of rotation of 90 rotation per minute (rpm) for 5 days. Next, the resulting matter was filtered through a membrane filter having an average pore size of 5.0 m and a balance of deionized water was added to obtain 90.0 parts of pigment dispersion PD31 (pigment solid concentration of 40 percent by mass).

Preparation of Ink

A total of 45.0 parts of the pigment dispersion PD31, 20.0 parts of urethane resin emulsion (TAKELAC™, WS-6021, manufactured by Mitsui Chemicals, Inc.), 6.9 parts of glycerin (manufactured by Kanto Chemical Co., Inc.), 4.5 parts of dispersion of silica fine particle (SNOWTEX$^{registered}$ ST-CM, proportion of silica fine particle adjusted to be 1.93 percent by mass to the entire of ink, manufactured by Nissan Chemical Corporation), 2.9 parts of triethylene glycol monobutyl ether (manufactured by Tokyo Chemical Industry Co. Ltd.), 0.9 parts of BYK-387, (polyether-silicone-based surfactant, manufactured by BYK-Chemie GmbH), 0.4 parts of triethanol amine (manufactured by Tokyo Chemical Industry Co. Ltd.), and the balance of deionized water to make the entire 100 parts were mixed and stirred for one hour, followed by filtering with a 1.2 μm membrane filter to obtain the ink 32 of the present disclosure.

Preparation of Aqueous Ink 33

Example 71

The pigment dispersion PD32 and the ink 33 were obtained in the same manner as in Example 31 except that the polymer CP31 prepared in Example 67 was used instead of the polymer CP1.

Preparation of Aqueous Ink 34

Example 72

The pigment dispersion PD33 and the ink 34 were obtained in the same manner as in Example 31 except that the polymer CP32 prepared in Example 68 was used instead of the polymer CP1.

Preparation of Aqueous Ink 35

Example 73

The pigment dispersion PD34 and the ink 35 were obtained in the same manner as in Example 31 except that the polymer CP33 prepared in Example 69 was used instead of the polymer CP1.

Preparation of Aqueous Ink 36

Example 74

The pigment dispersion PD35 and the ink 36 were obtained in the same manner as in the same manner as in Example 33 except that the copolymer CP34 prepared in Example 70 was used instead of the copolymer CP3 prepared in Example 33 and 2.9 parts of (2-hydroxyethyl) dimethyl amine prepared in Example 33 was replaced with 1.8 parts of sodium hydroxide (manufactured by Kanto Chemical Co., Inc.).

Preparation of Comparative Aqueous Ink Rink1

Comparative Example 7

The comparative pigment dispersion RPD1 and the comparative ink Rink 1 were obtained in the same manner as in Example 31 except that the comparative polymer RCP1 was used instead of the polymer CP1.

Preparation of Comparative Aqueous Ink Rink2

Comparative Example 8

The comparative pigment dispersion RPD2 and the comparative ink Rink 2 were obtained in the same manner as in Example 31 except that the comparative polymer RCP2 was used instead of the polymer CP1.

Preparation of Comparative Aqueous Ink Rink3

Comparative Example 9

The comparative pigment dispersion PD3 and the comparative ink Rink 3 were obtained in the same manner as in the same manner as in Example 33 except that the comparative copolymer RCP3 was used instead of the copolymer CP3 prepared in Example 33 and 2.9 parts of (2-hydroxyethyl)dimethyl amine prepared in Example 33 was replaced with 4.2 parts of (2-hydroxyethyl)dimethyl amine.

Preparation of Comparative Aqueous Ink Rink4

Comparative Example 10

The comparative pigment dispersion RPD4 and the comparative ink Rink 4 were obtained in the same manner as in Example 31 except that the comparative polymer RCP4 was used instead of the polymer CP1.

Preparation of Comparative Aqueous Ink RInk5

Comparative Example 11

The comparative pigment dispersion RPD5 and the comparative ink Rink 5 were obtained in the same manner as in Example 31 except that the comparative polymer RCP5 was used instead of the polymer CP1.

Preparation of Comparative Aqueous Ink RInk6

Comparative Example 12

The comparative pigment dispersion PD6 and the comparative ink Rink 6 were obtained in the same manner as in the same manner as in Example 33 except that the comparative copolymer RCP6 was used instead of the copolymer CP3 prepared in Example 33 and 2.9 parts of (2-hydroxyethyl)dimethyl amine prepared in Example 33 was replaced with 2.7 parts of (2-hydroxyethyl)dimethyl amine.

Evaluation on Storage Stability of Pigment Dispersion

A glass container was filled with each pigment dispersion and stored at 70 degrees C. for two weeks. The change ratio of the viscosity after the storage to the viscosity before the storage was obtained from the following relationship and evaluated according to the following criteria. The viscosity was measured at 25 degrees C. at 50 rotations using a viscometer (RE80L, manufactured by TOKI SANGYO CO., LTD.).

Viscosity change ratio (percent)=[(viscosity of pigment dispersion after storage−viscosity of pigment dispersion before storage)/viscosity of pigment dispersion before storage}×100

Evaluation Criteria

A: Viscosity change ratio within the range of from −5 percent to +5 percent

B: Viscosity change ratio within the range of from −8 percent to less than −5 percent and more than 5 percent to 8 percent C: Viscosity change ratio within the range of from −10 percent to less than −8 percent and more than 8 percent to 10 percent.

D: Viscosity change ratio within the range of from less than −10 percent to −30 percent and more than 10 percent to 30 percent E: Viscosity change ratio in the range of less than −30 percent or greater than 30 percent (gelated, evaluation was not possible)

Evaluation on Storage Stability of Ink

An ink cartridge was filled with each ink and stored at 70 degrees C. for one week. The viscosity change ratio of the viscosity after the storage to the viscosity before the storage was obtained from the following relationship and evaluated according to the following criteria. The viscosity was measured at 25 degrees C. at 50 rotations using a viscometer (RE80L, manufactured by TOKI SANGYO CO., LTD.).

Viscosity change ratio (percent)=[(viscosity of ink after storage−viscosity of ink before storage)/viscosity of ink before storage]×100

Evaluation Criteria

A: Viscosity change ratio within the range of from −5 percent to +5 percent

B: Viscosity change ratio within the range of from −8 percent to less than −5 percent and more than 5 percent to 8 percent B: Viscosity change ratio within the range of from −8 percent to less than −10 percent and more than 8 percent to 10 percent D: Viscosity change ratio within the range of from less than −10 percent to −30 percent and more than 10 percent to 30 percent E: Viscosity change ratio in the range of less than −30 percent or greater than 30 percent (gelated, evaluation was not possible)

Evaluation on Ink Dispersibility

Since it takes a long time before the ink component settles out by leaving, the ink component was settled out quickly using a centrifuge.

Firstly, the ink was placed in a test tube (PYREX$^{registered}$ IWAKI TE-32, 16.5 mm×105 mm, manufactured by AGC Inc.) to a height of 45 mm from the bottom), followed by capped with silicon plug to obtain a sample for evaluation. Secondly, to define the initial state of the sample, the front tip of 2 to 3 mm of a pipette dropper was dipped in the surface of the ink immediately after the sample was prepared, thereby obtaining about 0.02 mL (about 20 mg) of the ink. A total of 4 to 10 mg of the ink obtained was placed in a 50 mL sample bin, followed by diluting with deionized water at a factor of 4,000. Finally, the sample bin was placed on the mount of a mix rotor VMR-5R (manufactured by AS ONE CORPORATION), rotated at 60 rpm for 10 minutes or longer and immediately subjected to measuring the absorption spectrum of UV-VIS with an ultraviolet, visible light, and infra-red spectrophotometer V-680 (manufactured by JASCO Corporation). The measuring result was determined as the reference spectrum.

The measuring conditions are specified below:

UV-VIS Measuring Condition

Range of wavelength: 350 to 800 nm

Length of cell: 3 mm

Measuring conditions: UV/VIS band width of 2.0 nm; NIR band width of 4.0 nm; response of FAST; and scanning speed of 40 nm/minute Next, the evaluation sample was placed in a Hematocrit Centrifuge Inverter 3220 (manufactured by KUBOTA CORPORATION) and subjected to quick settling out at 300 rpm for 14 hours. The sample for evaluation taken out was quietly laid on its side and quietly placed on the mix rotor VMR-5R. After rotating at 60 rpm for one, two, three, or four minutes, the evaluation sample was immediately back to the original upright position. The sample was taken out from the surface of the ink in the same manner as described above, followed by measuring the absorption spectrum to determine the re-dispersion spectrum of one, two, three, or four minutes layer.

The re-dispersibility of the ink was obtained from the change ratio of the re-dispersion spectrum to the reference spectrum based on the following relationship and evaluated according to the following evaluation criteria.

Re-dispersibility (percent)=100×(absorbency of the peak wavelength of re-dispersion spectrum/absorbency of peak wavelength of reference spectrum)

Evaluation Criteria

A: Re-dispersibility was 90 percent or greater for the re-dispersion spectrum one minute later B: Re-dispersibility was 90 percent or greater for the re-dispersion spectrum two minutes later C: Re-dispersibility was 90 percent or greater for the re-dispersion spectrum three minutes later D: Re-dispersibility was 90 percent or greater for the re-dispersion spectrum four minutes later E: Re-dispersibility was 89 percent or less for the re-dispersion spectrum four minutes later The results of the storage stability and re-dispersibility of the pigment dispersions PD1 to PD31 of Examples 31 to 62, the pigment dispersions PD32 to PD35 of Examples 71 to 74, the inks 1 to 36, comparative pigment dispersions RPD1 to RPD 6 of Comparative Examples 7 to 12, and the relative inks Rinks 1 to 6 were shown in Table 4.

TABLE 4

| Example | (Co)polymer | Pigment dispersion | Ink | Storage Stability of dispersion | Ink Storage stability | Ink Re-dispersibility |
|---|---|---|---|---|---|---|
| Example 31 | CP1 | PD1 | Ink 1 | C | C | C |
| Example 32 | CP2 | PD2 | Ink 2 | B | B | C |
| Example 33 | CP3 | PD3 | Ink 3 | A | A | A |
| Example 34 | CP4 | PD4 | Ink 4 | C | C | C |
| Example 35 | CP5 | PD5 | Ink 5 | B | B | C |
| Example 36 | CP6 | PD6 | Ink 6 | A | A | A |
| Example 37 | CP7 | PD7 | Ink 7 | B | B | C |
| Example 38 | CP8 | PD8 | Ink 8 | A | A | A |
| Example 39 | CP9 | PD9 | Ink 9 | B | B | C |
| Example 40 | CP10 | PD10 | Ink 10 | A | A | A |
| Example 41 | CP11 | PD11 | Ink 11 | B | B | C |
| Example 42 | CP12 | PD12 | Ink 12 | A | A | A |
| Example 43 | CP13 | PD13 | Ink 13 | B | B | C |
| Example 44 | CP14 | PD14 | Ink 14 | A | A | A |
| Example 45 | CP15 | PD15 | Ink 15 | A | A | A |
| Example 46 | CP16 | PD16 | Ink 16 | A | A | A |
| Example 47 | CP17 | PD17 | Ink 17 | A | A | A |
| Example 48 | CP18 | PD18 | Ink 18 | A | A | A |
| Example 49 | CP19 | PD19 | Ink 19 | A | A | A |
| Example 50 | CP20 | PD20 | Ink 20 | A | A | A |
| Example 51 | CP21 | PD21 | Ink 21 | B | B | C |
| Example 52 | CP22 | PD22 | Ink 22 | A | A | A |
| Example 53 | CP23 | PD23 | Ink 23 | A | A | A |
| Example 54 | CP24 | PD24 | Ink 24 | A | A | A |
| Example 55 | CP25 | PD25 | Ink 25 | A | A | A |
| Example 56 | CP26 | PD26 | Ink 26 | B | B | C |
| Example 57 | CP27 | PD27 | Ink 27 | A | A | A |
| Example 58 | CP28 | PD28 | Ink 28 | A | A | A |
| Example 59 | CP29 | PD29 | Ink 29 | A | A | A |
| Example 60 | CP30 | PD30 | Ink 30 | A | A | A |
| Example 61 | CP1 | PD1 | Ink 31 | C | C | C |
| Example 62 | CP1 | PD31 | Ink 32 | C | C | C |
| Example 71 | CP31 | PD32 | Ink 33 | C | C | C |
| Example 72 | CP32 | PD33 | Ink 34 | C | C | C |
| Example 73 | CP33 | PD34 | Ink 35 | C | C | C |
| Example 74 | CP34 | PD35 | Ink 36 | C | D | B |
| Comparative Example 7 | RCP1 | RPD1 | Rink 1 | E | E | E |
| Comparative Example 8 | RCP2 | RPD2 | Rink 2 | E | E | E |
| Comparative Example 9 | RCP3 | RPD3 | Rink 3 | E | E | E |
| Comparative Example 10 | RCP4 | RPD4 | Rink 4 | C | C | D |
| Comparative Example 11 | RCP5 | RPD5 | Rink 5 | C | C | D |
| Comparative Example 12 | RCP6 | RPD6 | Rink 6 | E | E | D |

Manufacturing of Backsheet for Solar Cell

Example 63

Preparation of Liquid PC1 for Forming Protection Layer

A total of 45 parts of dimethyl formamide (manufactured by Kanto Chemical Co., Inc.) and 36 parts of the polymer CP2 prepared in Example 2 were added to a glass vessel and dissolved by stirring. Next, 10 parts of titanium oxide JR-405 (manufactured by TAYCA CORPORATION) was slowly added during stirring, followed by stirring for 12 hours. A total of 540.0 parts of 1 mm zirconia beads was added to the vessel, followed by dispersion with Big Rotor BR-2, manufactured by AS ONE Corporation, at a rate of rotation of 90 rotation per minute (rpm) for 5 days. The content in the vessel was filtered with a 5 μm membrane filter. Then the balance of dimethyl formamide (manufactured by Kanto Chemical Co., Inc.) and 4.0 parts of hexamethylene diisocyanate (manufactured by TOKYO CHEMICAL INDUSTRY CO., LTD.) were added to obtain 100.0 parts of the liquid PC1 for forming a protection layer (pigment solid content of 10 percent).

Manufacturing of Backsheet BS1 for Solar Cell

The liquid PC1 was applied to the surface of white polyethylene terephthalate film having a thickness of 75 m (Lumirror MX11, manufactured by Toray Industries, Inc.) using a wire bar, followed by drying at 150 degrees C. for five minutes to form a protection layer having a thickness of 2 m. The protection layer was aged at 50 degrees C. for three days to obtain a backsheet BS1 for solar cell.

Manufacturing of Backsheet BS2 for Solar Cell

Example 64

The liquid PC2 for forming protection layer and the backsheet BS2 for solar cell were obtained in the same manner as in Example 63 except that the polymer CP11 prepared in Example 11 was used instead of the polymer CP2 used in Example 63.

Manufacturing of Backsheet BS3 for Solar Cell

Example 65

The liquid PC3 for forming protection layer and the backsheet BS3 for solar cell were obtained in the same manner as in Example 63 except that the polymer CP21 prepared in Example 21 was used instead of the polymer CP2 used in Example 63.

Manufacturing of Backsheet BS4 for Solar Cell

Example 66

The liquid PC4 for forming protection layer and the backsheet BS4 for solar cell were obtained in the same manner as in Example 63 except that the polymer CP26 prepared in Example 26 was used instead of the polymer CP2 used in Example 63.

Manufacturing of Backsheet RBS1 for Solar Cell

Comparative Example 13

The liquid RPC1 for forming protection layer and the backsheet RBS1 for solar cell were obtained in the same manner as in Example 63 except that the comparative polymer RCP2 was used instead of the polymer CP2 used in Example 63.

Manufacturing of Backsheet RBS2 for Solar Cell

Comparative Example 14

The liquid RPC2 for forming protection layer and the backsheet RBS2 for solar cell were obtained in the same manner as in Example 63 except that the comparative polymer RCP5 was used instead of the polymer CP2 used in Example 63.

Evaluation on Resistance to Weather

Measuring of Initial Fracture Elongation Es

Each of the manufactured backsheets for solar cell was cut to have a size of 1 cm×10 cm and the cut sheet was measured regarding the fracture elongation of the backsheet for solar cell based on ASTM-D882 (Annual Book of ASTM STANDARDS, 1999 year version). The result was determined as the initial fracture elongation Es.

Measuring of Fracture Elongation Ee Over Time

Using a super Xenon weather meter SX 75 (manufactured by Suga Test Instruments Co., Ltd.), a test piece of 10 cm×20 cm of the backsheet for solar cell was repeatedly irradiated with ultraviolet without temperature control such that a cycle of irradiation of ultraviolet radiation for 108 minutes and irradiation of ultraviolet radiation for 12 minutes while spraying water to the test piece were repeated until the time of irradiation reached 3,000 hours under the conditions of a black panel temperature of 65 degrees C., relative humidity of 50 percent RH, illuminance of 180 $W/m^2$ (range of wavelength of from 300 to 400 nm). Next, the test piece was taken out and cut to a size of 1 cm×10 cm, followed by measuring its fracture elongation in the same manner as that in the above-mentioned. The measuring result was determined as the fracture elongation Ee over time.

Evaluation on Resistance to Weather

As the index for evaluating the resistance to weather, the fracture elongation holding ratio (percent) was calculated based on the following relationship: fracture elongation holding ratio=(Ee/Es)×100. The calculation results were used to evaluate the resistance to weather according to the following criteria.

Evaluation Criteria

A: Fracture elongation holding ratio of 50 percent or greater

B: Fracture elongation holding ratio of from 30 to less than 50 percent

A: Fracture elongation holding ratio of less than 30 percent

The results of resistance to weather of the backsheets BS1 to BS4 of Examples 63 to 66 and comparative backsheets RBS1 and RBS2 for solar cell of Comparative Examples 13 and 14 are shown in Table 5.

TABLE 5

| Example | (Co)polymer | Backsheet for solar cell | Resistance to weather |
|---|---|---|---|
| Example 63 | CP2 | BS1 | A |
| Example 64 | CP11 | BS2 | A |
| Example 65 | CP21 | BS3 | A |
| Example 66 | CP26 | BS4 | A |
| Comparative Example 13 | RCP2 | RBS1 | B |
| Comparative Example 14 | RCP5 | RBS2 | C |

Aspects of the present disclosure are, for example, as follows.

1. A polymer having a structural unit represented by the following Chemical Formula 1.

Chemical Formula 1

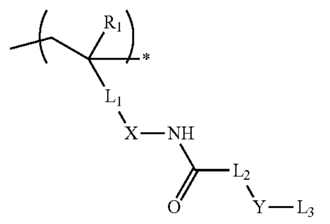

In Chemical Formula 1, $R_1$ represents hydrogen or a methyl group, $L_1$ represents —COO—, —CONH—, or a single bond, X represents a hydrocarbon group having 2 to 10 carbon atoms or a hydrocarbon group having 2 to 10 carbon atoms and containing oxygen, $L_2$ represents —O— or —NH—, Y represents a hydrocarbon group having 2 to 12 carbon atoms, and $L_3$ represents —NH—$C_2H_4$—$R_2$, —O-Ph-$CH_2CH(R_2)_2$, or —O—Np—$CH_2CH(R_2)_2$, where Ph represents a phenylene group, Np represents a naphthylene group, and $R_2$ represents a phosphonic acid group.

2. A copolymer having the structural unit represented by the Chemical Formula 1 of 1 mentioned above and a structural unit represented by the following Chemical Formula 2.

Chemical Formula 2

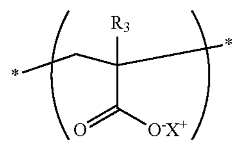

In Chemical Formula 2, $R_3$ represents hydrogen or a methyl group and $X^+$ represents a proton or a cation.

3. An ink contains water, a coloring material, and a resin containing at least one of the polymer of 1 mentioned above and the copolymer of 2 mentioned above.

4. The ink according to 3 mentioned above, wherein the polymer of 1 mentioned above or the copolymer of 2 mentioned above has a weight average molecular weight of from 5,000 to 50,000.

5. The ink according to any one of 3 to 4 mentioned above, wherein the coloring material contains titanium oxide.

6. An ink container containing the ink of any one of 3 to 5 mentioned above.

7. An image forming method includes discharging the ink of any one of 3 to 5 mentioned above to a printing medium to form an image thereon.

8. An image forming device includes an ink container of 6 mentioned above and a discharging device for discharging the ink accommodated in the ink container to a printing medium.

9. A backsheet for a solar cell includes a protection layer containing titanium oxide and resin, wherein the resin contains at least one of the polymer of 1 mentioned above and/or the copolymer of 2 mentioned above.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A polymer having a structural unit represented by the following Chemical Formula 1, Chemical Formula 1

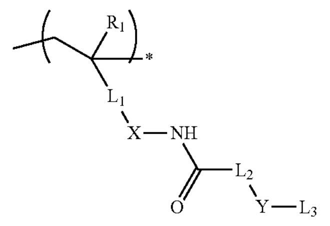

where $R_1$ represents hydrogen or a methyl group, $L_1$ represents —COO—, —CONH—, or a single bond, X represents a hydrocarbon group having 2 to 10 carbon atoms or a hydrocarbon group having 2 to 10 carbon atoms and containing oxygen, $L_2$ represents —NH—, Y represents a hydrocarbon group having 2 to 12 carbon atoms, and $L_3$ represents —NH—$C_2H_4$—$R_2$, —O-Ph-$CH_2CH(R_2)_2$, or —O—Np—$CH_2CH(R_2)_2$, where Ph represents a phenylene group, Np represents a naphthylene group, and $R_2$ represents a phosphonic acid group.

2. A copolymer having the structural unit represented by the Chemical Formula 1 of claim 1 and a structural unit represented by the following Chemical Formula 2, Chemical Formula 2

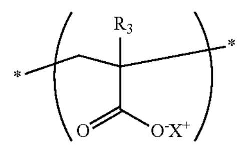

where $R_3$ represents hydrogen or a methyl group and X represents a proton or a cation.

3. An ink comprising:

water;

a coloring material; and a resin comprising at least one of the polymer of claim 1 or a copolymer having the structural unit represented by the Chemical Formula 1 and a structural unit represented by the following Chemical Formula 2, Chemical Formula 2

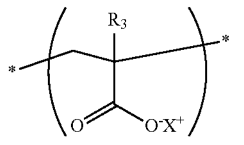

where $R_3$ represents hydrogen or a methyl group and $X^+$ represents a proton or a cation.

4. The ink according to claim 3, wherein the polymer or the copolymer has a weight average molecular weight of from 5,000 to 50,000.

5. The ink according to claim 3, wherein the coloring material comprises titanium oxide.

6. An ink container containing the ink of claim 3.

7. An image forming device comprising:

an ink container containing the ink of claim 3; and a discharging device configured to discharge the ink to a printing medium.

8. An image forming method comprising:

discharging the ink of claim 3 to a printing medium to form an image thereon.

9. A backsheet for a solar cell comprising:

a protection layer comprising titanium oxide and resin, wherein the resin comprises at least one of the polymer of claim 1 or a copolymer having the structural unit represented by the Chemical Formula 1 and a structural unit represented by the following Chemical Formula 2, Chemical Formula 2

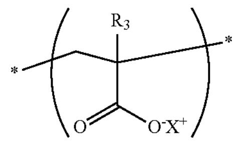

where $R_3$ represents hydrogen or a methyl group and $X^+$ represents a proton or a cation.

* * * * *